(12) United States Patent
Lin et al.

(10) Patent No.: US 12,376,403 B2
(45) Date of Patent: Jul. 29, 2025

(54) LOW-REFRACTIVITY GRID STRUCTURE AND METHOD FORMING SAME

(71) Applicant: Taiwan Semiconductor Manufacturing Co., Ltd., Hsinchu (TW)

(72) Inventors: Kun-Huei Lin, Tainan (TW); Yun-Wei Cheng, Taipei (TW); Chun-Hao Chou, Tainan (TW); Kuo-Cheng Lee, Tainan (TW); Cheng Yuan Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/818,635

(22) Filed: Aug. 9, 2022

(65) Prior Publication Data
US 2022/0384509 A1    Dec. 1, 2022

Related U.S. Application Data

(62) Division of application No. 16/990,647, filed on Aug. 11, 2020, now Pat. No. 11,728,364.

(51) Int. Cl.
*H10F 39/00* (2025.01)
*H10F 39/12* (2025.01)
(Continued)

(52) U.S. Cl.
CPC ....... *H10F 39/8067* (2025.01); *H10F 39/024* (2025.01); *H10F 39/182* (2025.01);
(Continued)

(58) Field of Classification Search
CPC .. H10F 39/199; H10F 39/807; H10F 39/8053; G02B 5/20; G02B 5/201; H01L 27/14629; H01L 27/14621; H01L 27/14627; H01L 27/1463; H01L 27/14634; H01L 27/1464; H01L 27/14645; H01L 27/14685; H01L 27/14689; H01L 27/1469;
(Continued)

(56) References Cited

U.S. PATENT DOCUMENTS

| 8,940,574 B2 | 1/2015 | Wang |
| 9,437,645 B1 | 9/2016 | Chou |

(Continued)

FOREIGN PATENT DOCUMENTS

| CN | 103378111 A | 10/2013 |
| CN | 103426890 A | 12/2013 |

(Continued)

*Primary Examiner* — Nelson Garces
(74) *Attorney, Agent, or Firm* — Slater Matsil, LLP

(57) ABSTRACT

A method includes forming image sensors in a semiconductor substrate, thinning the semiconductor substrate from a backside of the semiconductor substrate, forming a dielectric layer on the backside of the semiconductor substrate, and forming a polymer grid on the backside of the semiconductor substrate. The polymer grid has a first refractivity value. The method further includes forming color filters in the polymer grid, wherein the color filters has a second refractivity value higher than the first refractivity value, and forming micro-lenses on the color filters.

20 Claims, 18 Drawing Sheets

(51) Int. Cl.
*H10F 39/18* (2025.01)
*G02B 5/20* (2006.01)

(52) U.S. Cl.
CPC ....... *H10F 39/199* (2025.01); *H10F 39/8053* (2025.01); *H10F 39/8063* (2025.01); *H10F 39/807* (2025.01); *H10F 39/809* (2025.01); *G02B 5/20* (2013.01)

(58) Field of Classification Search
CPC ......... H01L 27/14625; H01L 27/14632; H01L 27/14643; H01L 27/14687
See application file for complete search history.

(56) References Cited

U.S. PATENT DOCUMENTS

| | | | |
|---|---|---|---|
| 9,564,468 B2 | 2/2017 | Chou | |
| 10,424,611 B2 | 9/2019 | Ihara | |
| 11,031,434 B2 | 6/2021 | Tsao | |
| 2006/0189062 A1* | 8/2006 | Deng | H01L 27/14685 257/431 |
| 2013/0207213 A1 | 8/2013 | JangJian et al. | |
| 2013/0241018 A1 | 9/2013 | Jangjian | |
| 2013/0307104 A1 | 11/2013 | Tsai et al. | |
| 2014/0339606 A1* | 11/2014 | Lin | H01L 27/14621 438/70 |
| 2015/0014802 A1 | 1/2015 | Cheng et al. | |
| 2015/0171125 A1 | 6/2015 | Jangjian | |
| 2016/0211290 A1* | 7/2016 | Tsai | H01L 27/14689 |
| 2016/0307941 A1* | 10/2016 | Cheng | H01L 27/14623 |
| 2016/0307942 A1 | 10/2016 | Cheng et al. | |
| 2016/0336367 A1 | 11/2016 | Chuang et al. | |
| 2017/0200757 A1 | 7/2017 | Ihara | |
| 2018/0040656 A1 | 2/2018 | Jang et al. | |
| 2019/0067355 A1* | 2/2019 | Li | H01L 27/14607 |
| 2019/0148434 A1 | 5/2019 | Hsu | |
| 2020/0135798 A1 | 4/2020 | Tsao et al. | |
| 2020/0219920 A1 | 7/2020 | Hur | |
| 2020/0403025 A1* | 12/2020 | Kim | H01L 27/1464 |
| 2021/0202546 A1* | 7/2021 | Liu | H01L 27/1463 |

FOREIGN PATENT DOCUMENTS

| | | |
|---|---|---|
| CN | 104282699 A | 1/2015 |
| CN | 105990383 A | 10/2016 |
| CN | 105990384 A | 10/2016 |
| CN | 107068703 A | 8/2017 |
| CN | 111129044 A | 5/2020 |
| KR | 20130093450 A | 8/2013 |
| KR | 20170084519 A | 7/2017 |
| KR | 20180016699 A | 2/2018 |
| KR | 20200050360 A | 5/2020 |

\* cited by examiner

LOW-REFRACTIVITY GRID STRUCTURE AND METHOD FORMING SAME

PRIORITY CLAIM AND CROSS-REFERENCE

This application is a divisional of U.S. patent application Ser. No. 16/990,647, entitled "Low-Refractivity Grid Structure and Method Forming Same," filed on Aug. 11, 2020, which application is incorporated herein by reference.

BACKGROUND

Semiconductor image sensors are operated to sense light. Typically, the semiconductor image sensors include Complementary Metal-Oxide-Semiconductor (CMOS) Image Sensors (CIS) and Charge-Coupled Device (CCD) sensors, which are widely used in various applications such as Digital Still Camera (DSC), mobile phone camera, Digital Video (DV) and Digital Video Recorder (DVR) applications. These semiconductor image sensors utilize an array of image sensor elements, with each image sensor element including a photodiode and other elements, to absorb light and convert the sensed light into digital data or electrical signals.

Front Side Illumination (FSI) CMOS image sensors and Backside Illumination (BSI) CMOS image sensors are two major types of CMOS image sensors. The FSI CMOS image sensors are operable to detect light projected from their front sides, while the BSI CMOS image sensors are operable to detect light projected from their backsides. When light projected into the FSI CMOS image sensors or the BSI CMOS image sensors, photoelectrons are generated and then are sensed by light-sensing devices in the pixels of the image sensors. The more the photoelectrons are generated, the better Quantum Efficiency (QE) the image sensors has, thus improving the image quality of the CMOS image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
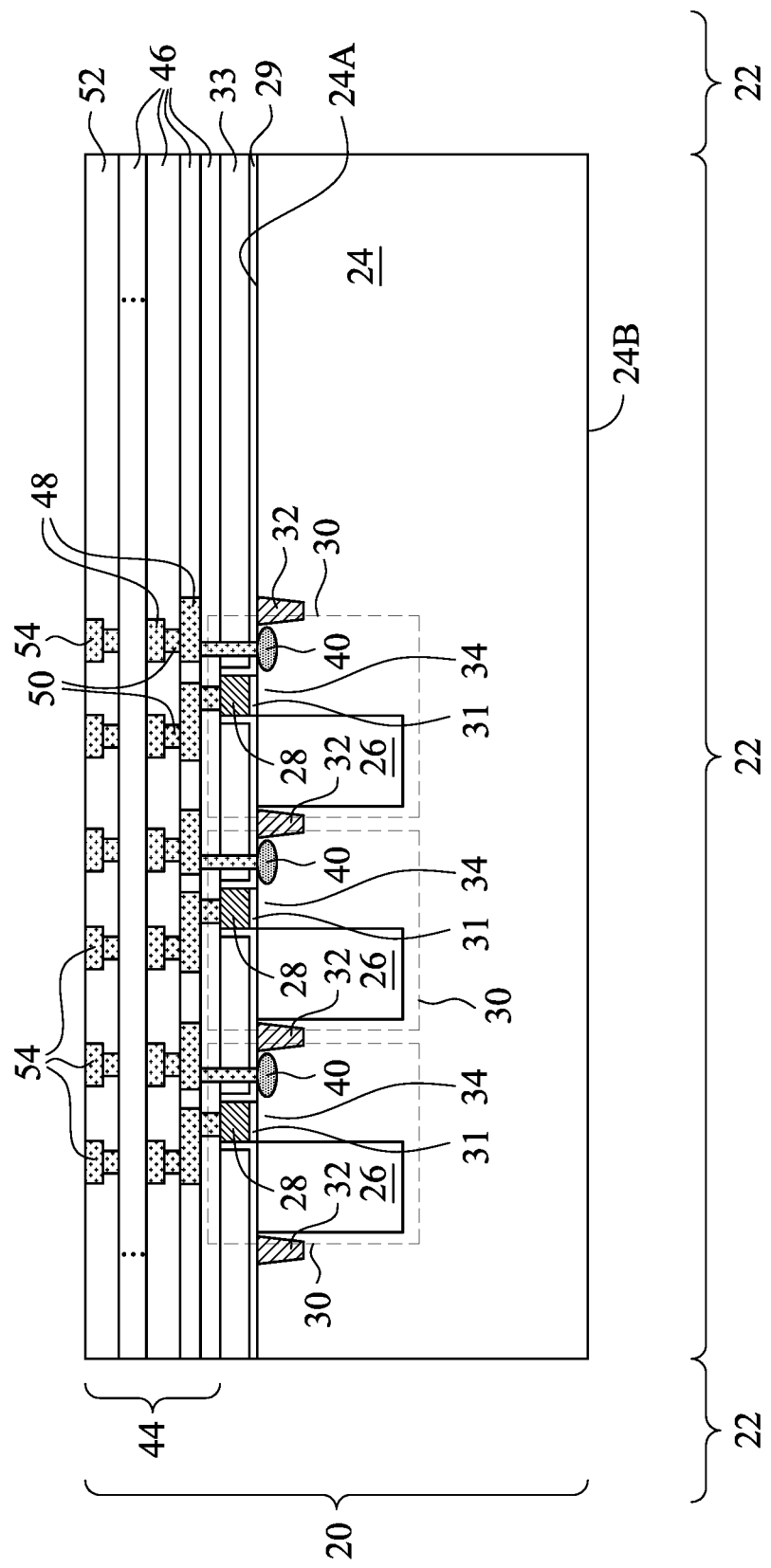
FIGS. 1-13 illustrate the cross-sectional views of intermediate stages in the formation of an image sensor chip having a low-refractivity grid structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Backside Illumination (BSI) image sensor chip and the method of forming the same are provided in accordance with some embodiments of the present disclosure. In accordance with some embodiments, the BSI image sensor chip includes a low-refractivity grid, which may be or may comprise polymer. Color filters are formed in the low-refractivity grid. The color filters have higher refractivity values than the low-refractivity grid, and light may be reflected from the sidewalls of the low-refractivity grid through total reflection. The intermediate stages in the formation of the BSI image sensor chip are illustrated in accordance with some embodiments of the present disclosure. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 18:
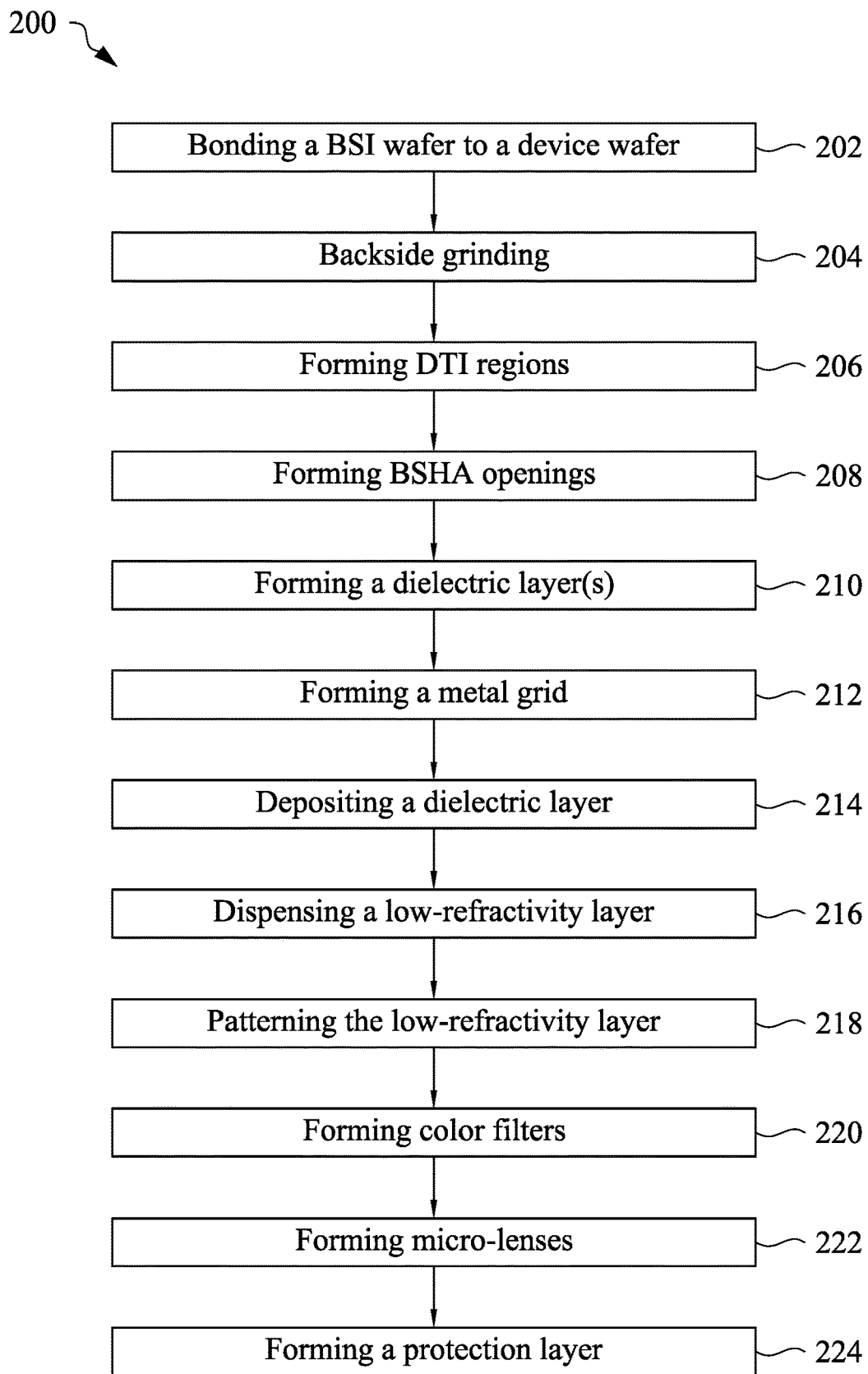
FIG. 18 illustrates a process flow for forming an image sensor chip in accordance with some embodiments.

FIGS. 1 through 13 illustrate the cross-sectional views of intermediate stages in the formation of an image sensor chip including a low-refractivity grid in accordance with some embodiments of the present disclosure. The corresponding processes are also reflected schematically in the process flow 200 shown in FIG. 18.

FIG. 1 illustrates the formation of an initial structure of image sensor chip 22, which may be a part of wafer 20 that includes a plurality of image sensor chips 22 therein. Image sensor chip 22 includes semiconductor substrate 24. In accordance with some embodiments of the present disclosure, semiconductor substrate 24 is a crystalline silicon substrate. In accordance with other embodiments of the present disclosure, semiconductor substrate 24 includes an elementary semiconductor such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates such as multi-layered or gradient substrates may also be used. Throughout the description, major surface 24A of substrate 24 is referred to as a front surface of semiconductor substrate 24, and major surface 24B is referred to as a back surface of semiconductor substrate 24. Surfaces 24A and 24B may be on (100) or (001) surface planes.

Figure 16:
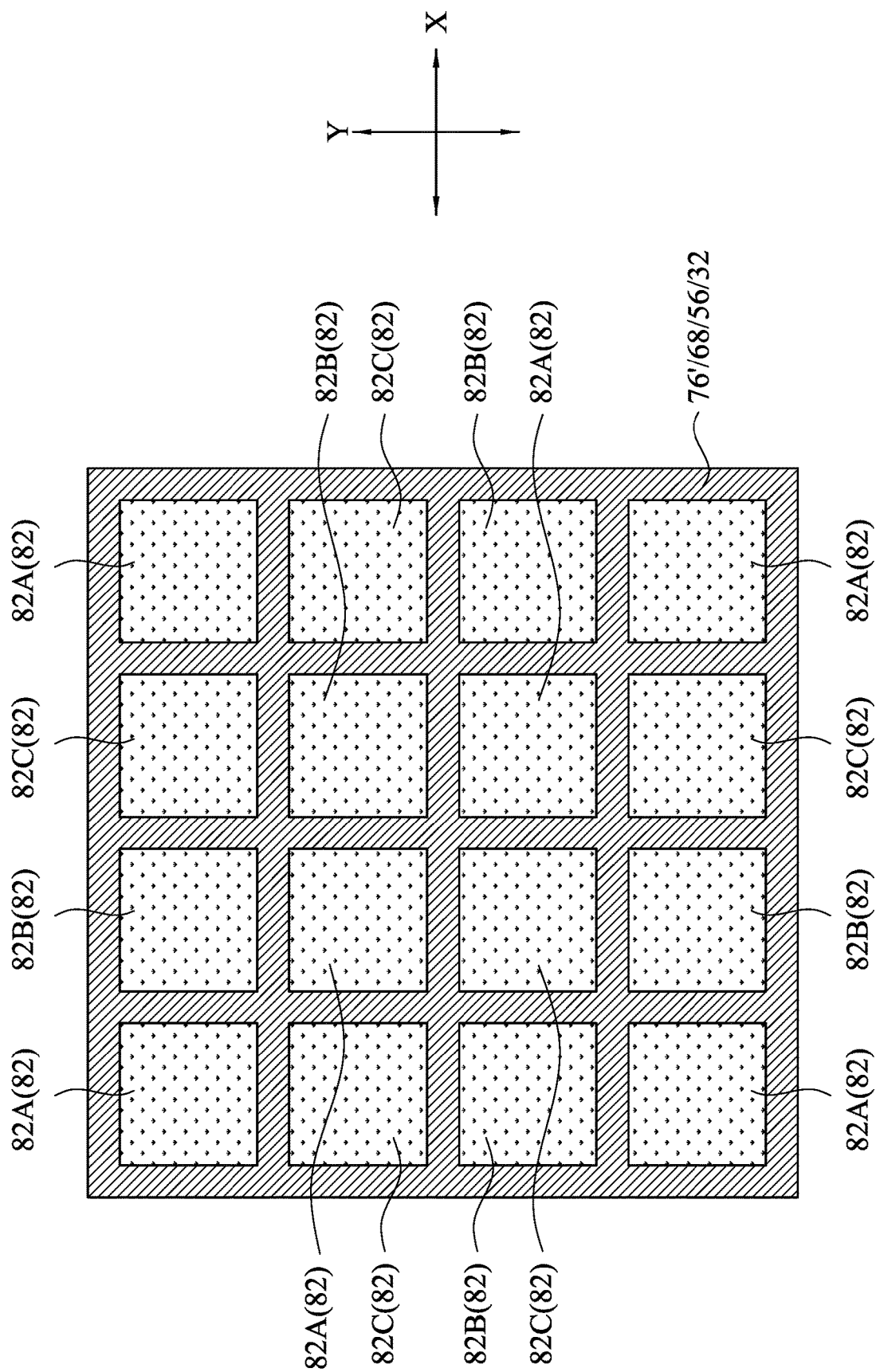
FIG. 16 illustrates a plane view of a low-refractivity grid structure and the respective color filters in accordance with some embodiments.

Isolation regions, which are alternatively referred to as Shallow Trench Isolation (STI) regions, are formed to extend into semiconductor substrate 24 to define regions (such as active regions). In accordance with some embodiments of the present disclosure, the STI regions include a plurality of parts having different functions. For example, the STI regions include an STI grid structure 32 as illustrated. The STI regions may include other STI regions (not shown), which may be used, for example, for defining regions for devices such as transistors, for forming metal pads from the backside of the wafer 20, etc. STI grid structure 32 is a grid for forming an image sensor array therein. A plane view of the STI grid structure 32 is shown in FIG. 16. The STI grid structure 32 includes a first plurality of strips (grid lines) extending in the X-direction, and a second plurality of grid lines extending in the Y-direction and joined with the first plurality of grid lines.

Referring back to FIG. 1, image sensors 26 are formed to extend from front surface 24A into semiconductor substrate 24. The formation of image sensors 26 may include implantation processes. Image sensors 26 are configured to convert light signals (photons) to electrical signals. Image sensors 26 may be photo-sensitive Metal-Oxide-Semiconductor (MOS) transistors, photo-sensitive diodes, or the like. Throughout the description, Image sensors 26 are alternatively referred to as photo diodes 26, although they may be other types of image sensors. In accordance with some embodiments of the present disclosure, photo diodes 26 form an image sensor array. Each of photo diodes 26 may be in a grid unit in STI grid structure 32.

Figure 17:
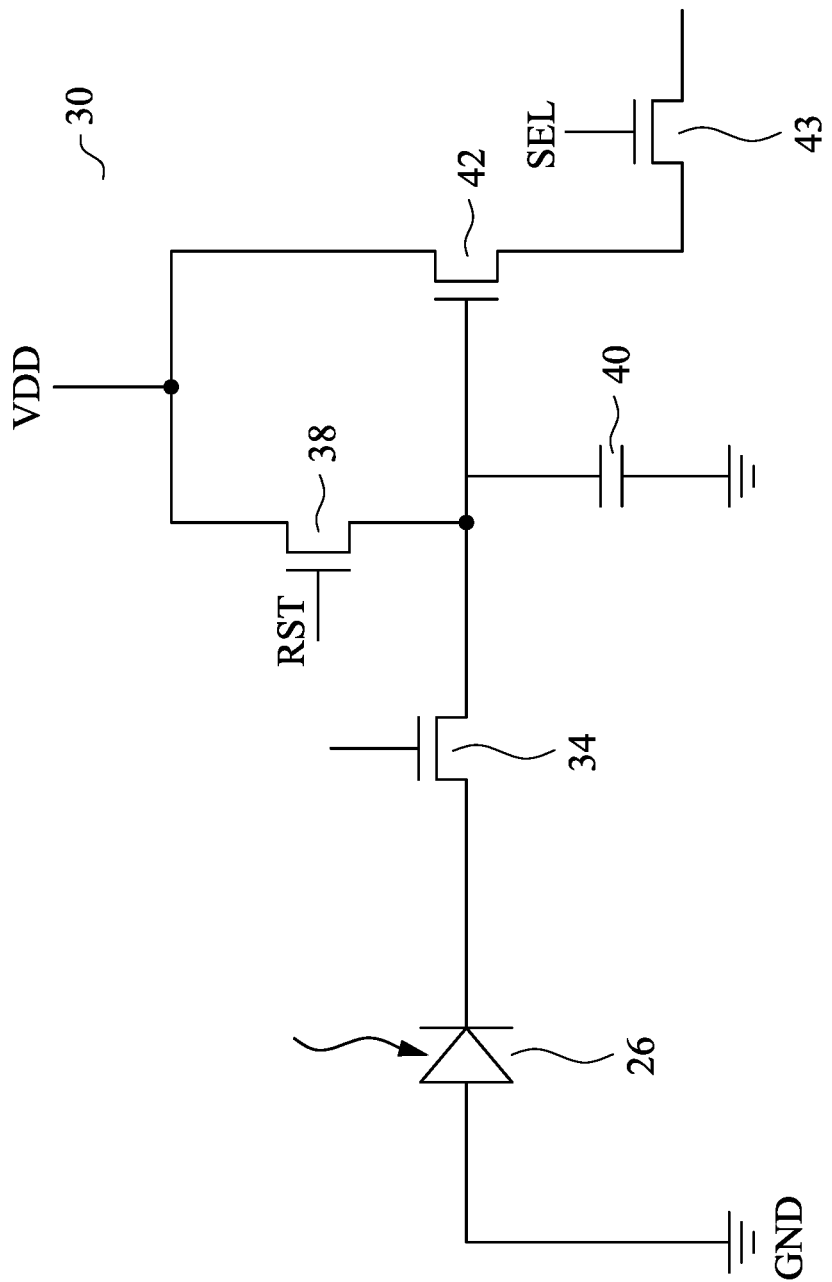
FIG. 17 illustrates the circuit diagram of a pixel of an image sensor in accordance with some embodiments.

FIG. 1 also illustrates pixel units 30, which have at least some parts in the active regions defined by STI grid structure 32. FIG. 17 illustrates a circuit diagram of an example pixel unit 30. In accordance with some embodiments of the present disclosure, pixel unit 30 includes photo diode 26, which has an anode coupled to the electrical ground GND, and a cathode coupled to a source of transfer gate transistor 34. The drain of transfer gate transistor 34 may be coupled to a drain of reset transistor 38 and a gate of source follower 42. Reset transistor 38 has a gate coupled to a reset line RST. A source of reset transistor 38 may be coupled to the pixel power supply voltage VDD. Floating diffusion capacitor 40 may be coupled between the source/drain of transfer gate transistor 34 and the gate of source follower 42. Reset transistor 38 is used to preset the voltage at floating diffusion capacitor 40 to VDD. A drain of source follower 42 is coupled to a power supply voltage VDD. A source of source follower 42 is coupled to row selector 43. Source follower 42 provides a high-impedance output for pixel unit 30. The row selector 43 functions as the select transistor of the respective pixel unit 30, and the gate of the row selector 43 is coupled to select line SEL.

Referring back to FIG. 1, a transistor is illustrated as an example of the devices (such as transistors 34, 38, 42, and 43 in FIG. 17) in pixel unit 30. For example, transfer gate transistor 34 is illustrated in FIG. 1 as an example. In accordance with some embodiments of the present disclosure, each of photo diodes 26 is electrically coupled to a first source/drain region of transfer gate transistor 34, which includes gate 28 and gate dielectric 31. Gate dielectric 31 is in contact with front surface 24A of substrate 24. The first source/drain region of the transfer gate transistor 34 may be shared by the corresponding connecting photo diode 26. Floating diffusion capacitor 40 is formed in substrate 24, for example, by implanting substrate 24 with a p-type impurity and an n-type impurity to different depths in order to form a p-n junction, which acts as the floating diffusion capacitor 40. Floating diffusion capacitor 40 may be formed in a second source/drain region of transfer gate transistor 34, and hence one of the capacitor plates of floating diffusion capacitor 40 is electrically coupled to the second source/drain region of transfer gate transistor 34. Photo diodes 26, the respective transfer gate transistors 34, and floating diffusion capacitors 40 in the same active region form parts of the pixel units 30 as also marked in FIG. 1.

Referring again to FIG. 1, Contact Etch Stop Layer 29 is formed on substrate 24 and transistors such as transfer gate transistors 34. CESL 29 may be formed of silicon oxide, silicon nitride, silicon carbo-nitride, or the like, or the multi-layers thereof. CESL 29 may be formed using a conformal deposition method such as Atomic Layer Deposition (ALD) or Chemical Vapor Deposition (CVD), for example. Inter-Layer Dielectric (ILD) 33 is formed over CESL 29. ILD 33 may include a dielectric material formed using, for example, Flowable Chemical Vapor Deposition (FCVD), spin-on coating, CVD, or another deposition method. ILD 33 may also be formed of an oxygen-containing dielectric material, which may be an oxide such as silicon oxide, Phospho-Silicate Glass (PSG), Boro-Silicate Glass (BSG), Boron-Doped Phospho-Silicate Glass (BPSG), or the like.

Front-side interconnect structure 44 is formed over semiconductor substrate 24. Front-side interconnect structure 44 is used to electrically interconnect the devices in image sensor chip 22, and connect to other package components. Front-side interconnect structure 44 includes dielectric layers 46, and metal lines 48 and vias 50 in dielectric layers 46. Throughout the description, the metal lines 48 in a same dielectric layer 46 are collectively referred to as being a metal layer. Front-side interconnect structure 44 may include a plurality of metal layers. In accordance with some embodiments of the present disclosure, dielectric layers 46 include low-k dielectric layers. The low-k dielectric layers have low k values, for example, lower than 3.8, and possibly lower than about 3.0.

Surface dielectric layer 52 is formed as a top dielectric layer of wafer 20. Surface dielectric layer 52 may be formed of a non-low-k dielectric material having a k value equal to or greater than about 3.8. In accordance with some embodiments of the present disclosure, surface dielectric layer 52 is formed of or comprises silicon oxide, silicon oxy-nitride, silicon oxy carbide, or the like.

Bonding pads 54 are further formed at the top of wafer 20. Bonding pads 54 may be formed of or comprise copper. Bonding pads 54 may also include barrier layers encircling the copper. The top surfaces of bonding pads 54 may be coplanar with the top surface of surface dielectric layer 52.

Figure 2:
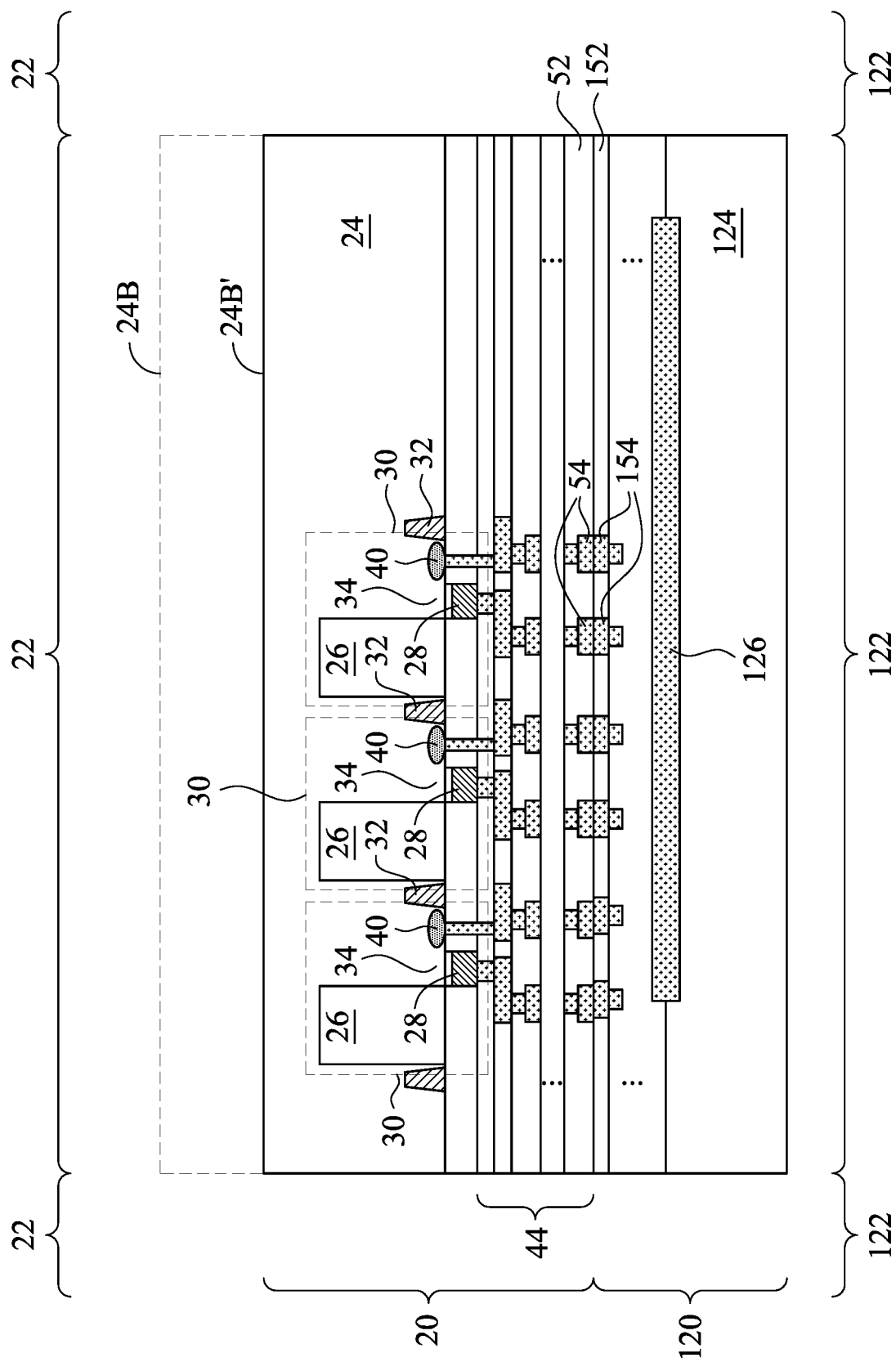

Next, referring to FIG. 2, wafer 20 is bonded to wafer 120. The respective process is illustrated as process 202 in the process flow shown in FIG. 18. In accordance with some embodiments of the present disclosure, the bonding is performed through hybrid bonding. Accordingly, surface dielectric layer 52 in wafer 20 is bonded to surface dielectric layer 152 in wafer 120 through fusion bonding, for example, with S—O—Si bonds being formed. Bond pads 54 of wafer 20 are also bonded to the metal pads 154 in wafer 120 through metal-to-metal direct bonding. Through bond pads 54 and 154, the circuits in wafer 120 are electrically and signally connected to the image sensor circuits in wafer 20.

In accordance with some embodiments of the present disclosure, wafer 120 includes chips 122, which further includes logic circuits 126 formed on the surface of semiconductor substrate 124. The logic circuits 126 may include the application circuit used for processing the electrical signal obtained from BSI chip 22. For example, the logic circuits 126 may include one or more of Image Signal Processing (ISP) circuits that are used for processing the image-related signals obtained from image sensor chip 22. The Image Signal Processing (ISP) circuits may include Analog-to-Digital Converters (ADCs), Correlated Double Sampling (CDS) circuits, row decoders, and the like.

Further referring to FIG. 2, a backside grinding process is performed to grind back surface 24B and to thin semiconductor substrate 24. The respective process is illustrated as process 204 in the process flow shown in FIG. 18. The resulting back surface of semiconductor substrate 24 is shown as back surface 24B' in FIG. 2. The thickness of substrate 24 may be reduced to smaller than about 20 µm, smaller than about 15 µm, or smaller than about 6 µm, so that light can penetrate from back surface 24B' into semiconductor substrate 24 and reaches photo diodes 26.

Figure 3:
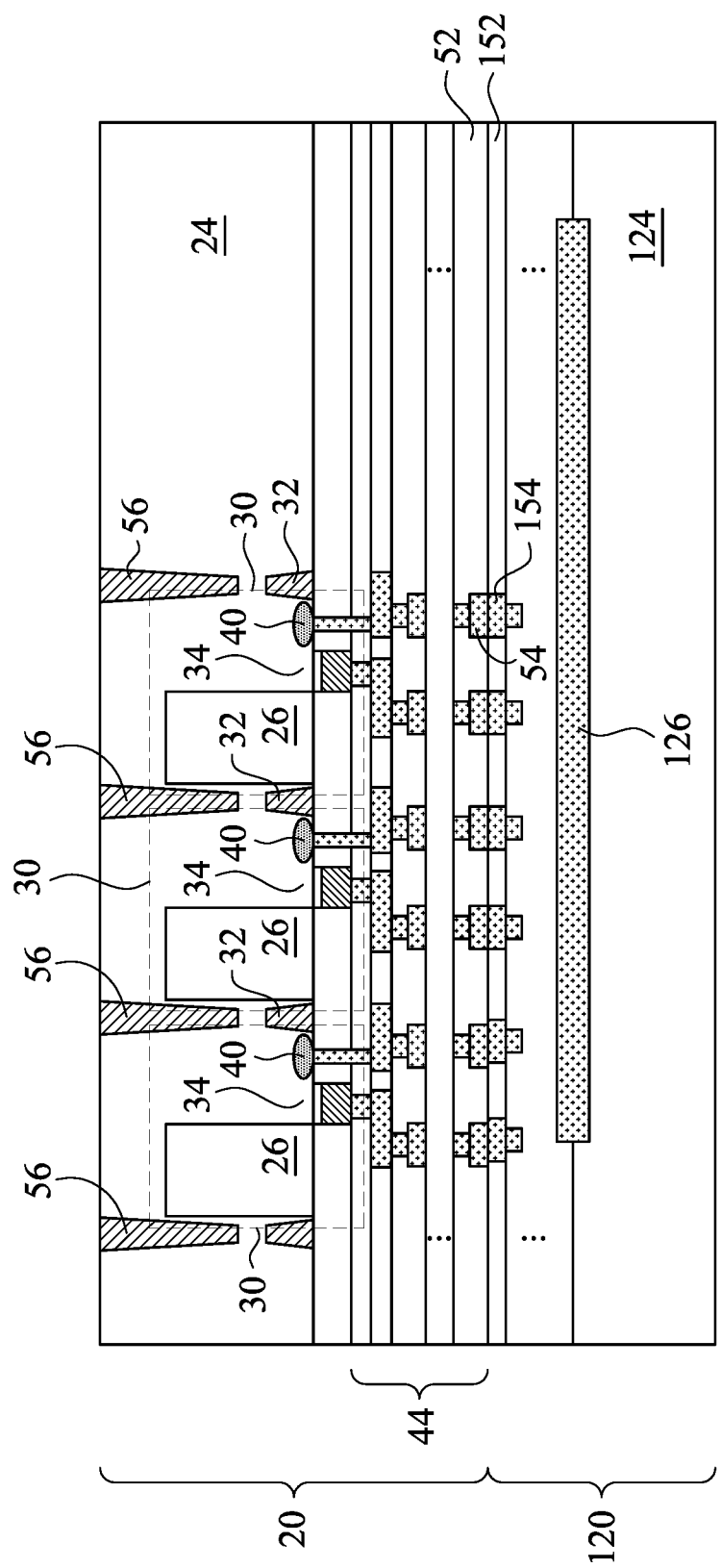

Referring to FIG. 3, Deep Trench Isolation (DTI) regions 56 are formed. The respective process is illustrated as process 206 in the process flow shown in FIG. 18. In accordance with some embodiments of the present disclosure, the formation of DTI regions 56 include etching semiconductor substrate 24, and filling the resulting trenches with a high-k dielectric material such as $Ta_2O_5$, an opaque material such as a metal (tungsten, for example), or combinations thereof. A planarization process such as a Chemical Mechanical Polish (CMP) process or a mechanical grinding process is then performed to remove excess materials, leaving DTI regions 56. DTI regions 56 have the function of preventing light to penetrate through, and have the function of preventing the cross-talk of light signals. In accordance with some embodiments of the present disclosure, DTI regions 56 form a grid, with the grid lines of DTI regions 56 vertically aligned to (flushed with) the grid lines of STI grid structure 32. DTI regions 56 may have voids therein in accordance with some embodiments. DTI regions 56 are collectively referred to as DTI grid structure 56 hereinafter. A plane view of DTI grid structure 56 is illustrated in FIG. 16. As shown in FIG. 16, in the plane view, DTI grid structure 56 includes a first plurality of strips (grid lines) extending in the X-direction, and a second plurality of grid lines extending in the Y-direction and joined with the first plurality of grid lines.

Figure 4:
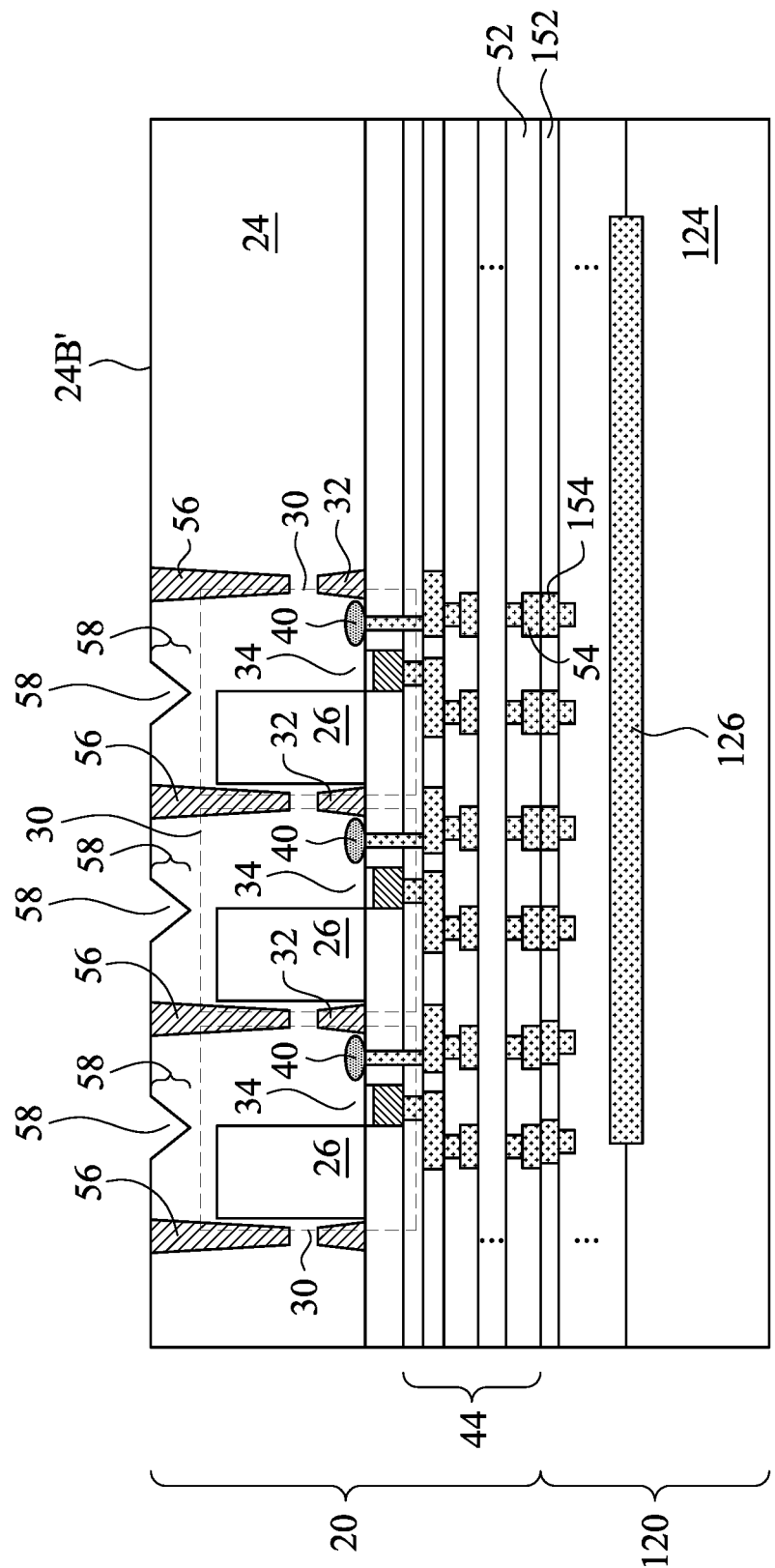

FIG. 4 illustrates the formation of openings 58, in which Backside High Absorption (BSHA) regions 60 (FIG. 7) are to be formed. The respective process is illustrated as process 208 in the process flow shown in FIG. 18. Openings 58 are accordingly referred to as BSHA openings 58 hereinafter. BSHA regions 60 have the function of focusing light. In accordance with some embodiments of the present disclosure, there is a single one or a plurality of (such as two, three, four or more) BSHA openings 58 overlapping the same pixel unit 30. In accordance with some embodiments of the present disclosure, the formation of BSHA openings 58 includes forming an etching mask (not shown) such as a patterned photo resist over semiconductor substrate 24. The etching mask has openings aligning to the pixel units, with each opening corresponding to one BSHA opening 58 that is to be formed. Semiconductor substrate 24 is then etched through the openings in the etching mask to form a plurality pyramid shaped openings, which may be achieved through a wet etching process, so that the etching along the lattice direction of the semiconductor substrate 24 will result in the pyramid shaped openings.

Figure 5:
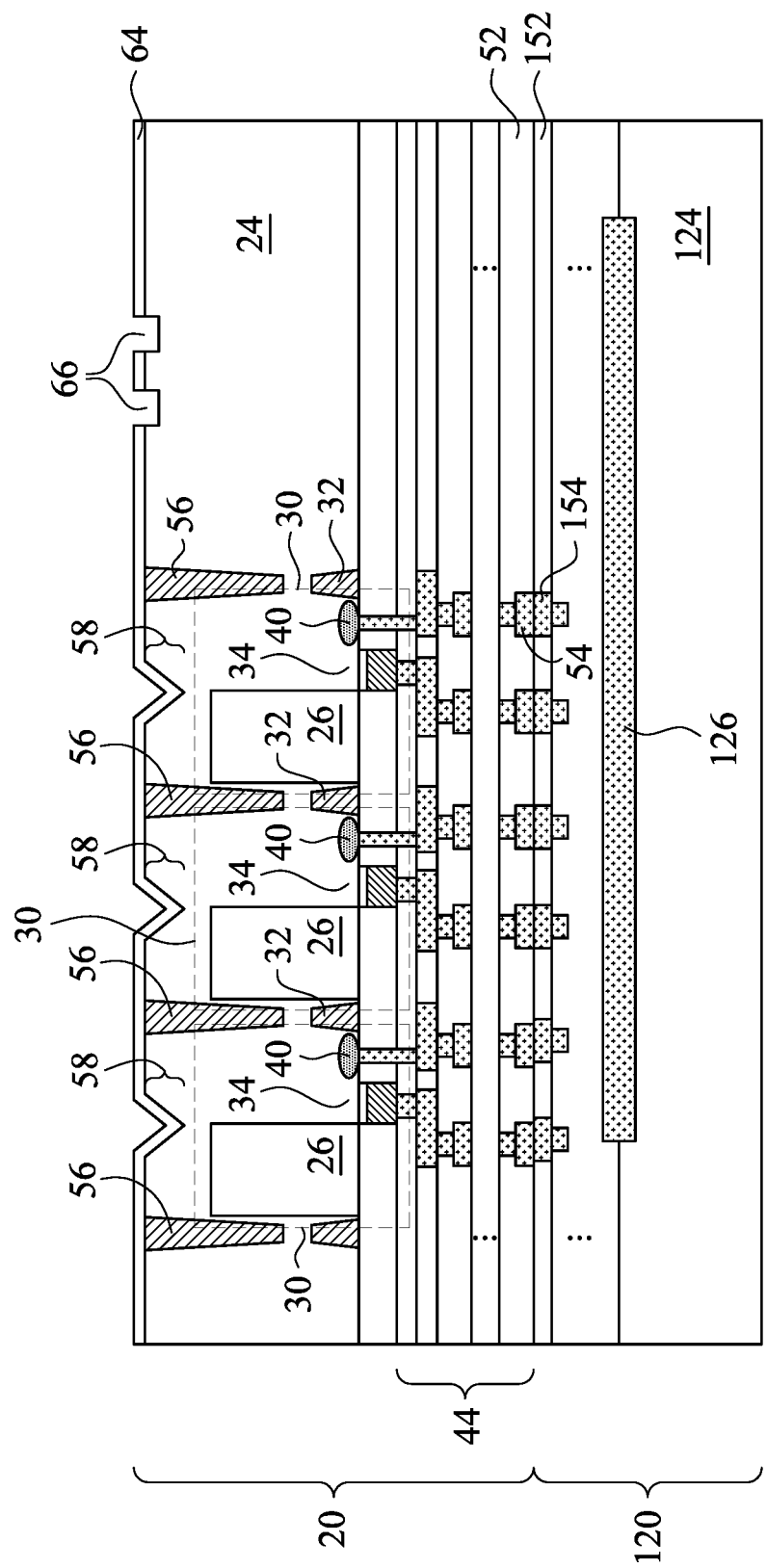

FIG. 5 illustrates the formation of dielectric layer 64. The respective process is illustrated as process 210 in the process flow shown in FIG. 18. In accordance with some embodiments of the present disclosure, dielectric layer 64 has a single-layer structure or a multi-layer structure. For example, dielectric layer 64 may include silicon oxide layer and/or a high-k dielectric layer(s) including an aluminum oxide layer, a hafnium oxide layer, a tantalum oxide ($Ta_2O_5$) layer, or multi-layers thereof. The silicon oxide layer may be formed through thermal oxidation or a deposition process. The corresponding deposition process of the silicon oxide layer or the high-k dielectric layer may include Chemical Vapor Deposition (CVD), Plasma Enhanced Chemical Vapor Deposition (PECVD), Atomic Layer Deposition (ALD), or the like. Dielectric layer 64 may be formed as a conformal layer extending into, and partially filling, BSHA openings 58. In accordance with some embodiments, dielectric layer 64 may further include an additional transparent dielectric layer over the high-k dielectric layers. The dielectric layer may be formed of silicon oxide or a like material. The deposition process may include CVD, PECVD, ALD, or the like.

In accordance with some embodiments, after the deposition of dielectric layer 64, an etching process is performed to etch dielectric layer 64, with openings 66 being formed to penetrate through dielectric layer 64. Semiconductor substrate 24 is thus exposed to openings 66.

Figure 6:
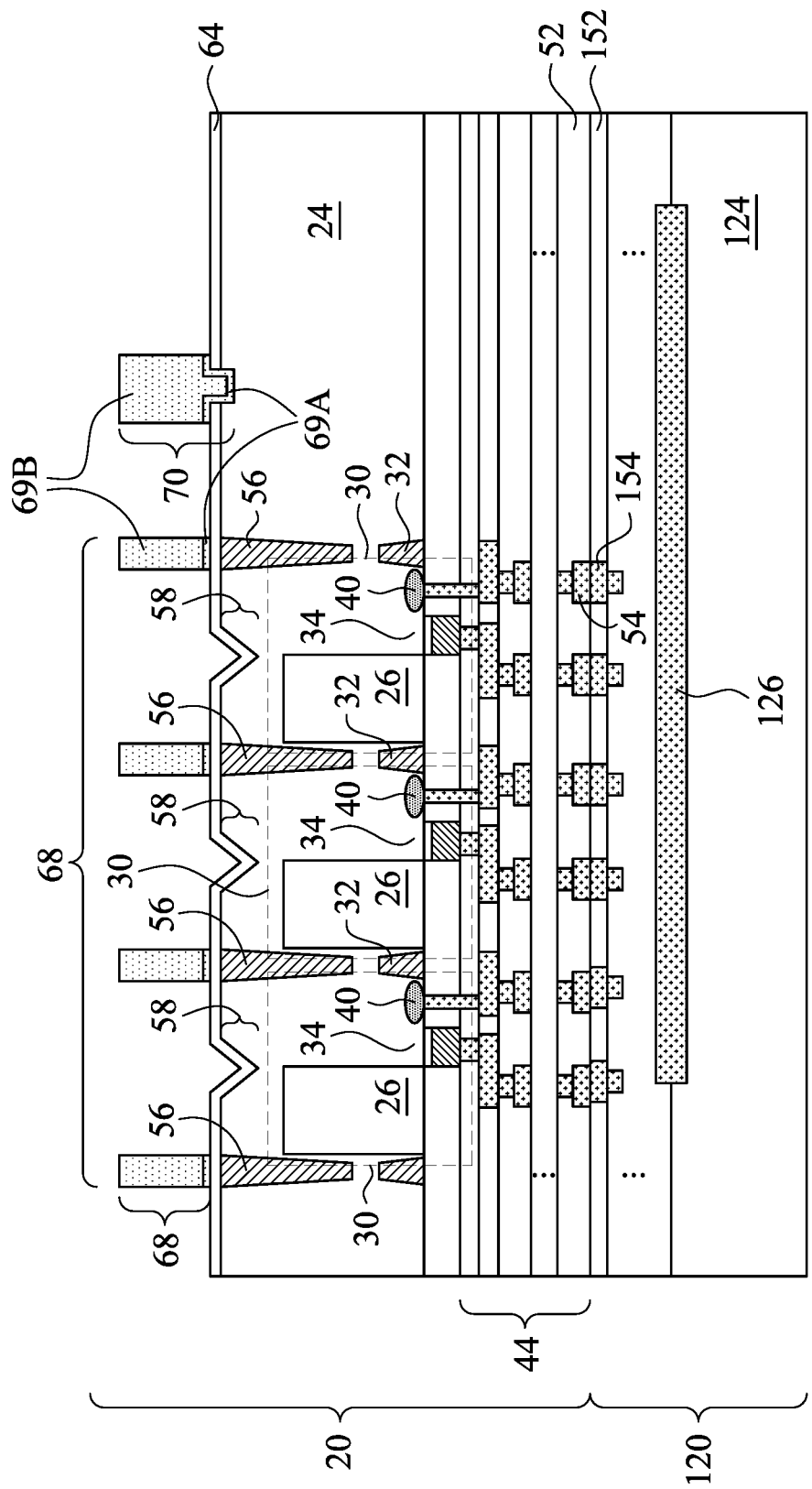

FIG. 6 illustrates the formation of grid structure 68 and metal grounding structure 70 in accordance with some embodiments of the present disclosure. The respective process is illustrated as process 212 in the process flow shown in FIG. 18. In accordance with some embodiments, grid structure 68 and metal grounding structure 70 are formed in a deposition-and-patterning process. For example, metallic materials are first deposited. In accordance with some embodiments of the present disclosure, the metallic materials include adhesion layer 69A, and metallic material 69B over adhesion layer 69A. Adhesion layer 69A may include a titanium layer, a titanium nitride layer, or a composite layer including a titanium layer and a titanium nitride layer over the titanium layer. The adhesion layer 69A may have a thickness in the range between about 400 Å and about 600 Å. Metallic material 69B may include tungsten, chromium, or the like, and may have a thickness in the range between about 1.5 kÅ and about 2.5 kÅ.

After the deposition of the metallic materials, a patterning process is performed through etching, and metallic material 69B and adhesion layer 69A are patterned as grid structure 68 and grounding structure 70. When viewed from the top of the grid structure 68, as shown in FIG. 16 in an example embodiment, grid structure 68 may also include a first plurality of strips (grid lines) extending in the X-direction, and a second plurality of strips extending in the Y-direction, wherein the second plurality of grid lines are joined with the first plurality of grid lines to form the grid structure 68. The grid openings in grid structure 68 further overlap the grid openings of DTI grid structure 56 and STI grid structure 32, so that light can pass through, and can be confined in, the openings to reach the underlying photo diodes 26. The grounding structure 70 extends into the openings in dielectric layer 64 to physically contact and electrically connected to semiconductor substrate 24.

In accordance with alternative embodiments, grid structure 68, instead of being formed of metallic materials, may be formed of or comprise a dielectric material. For example, grid structure 68 may be formed of or comprise silicon oxide, silicon oxide nitride, metal, low-refractivity polymer, or the like. The formation process may also include depositing one or a plurality of dielectric layers, and patterning the dielectric layers.

Figure 7:
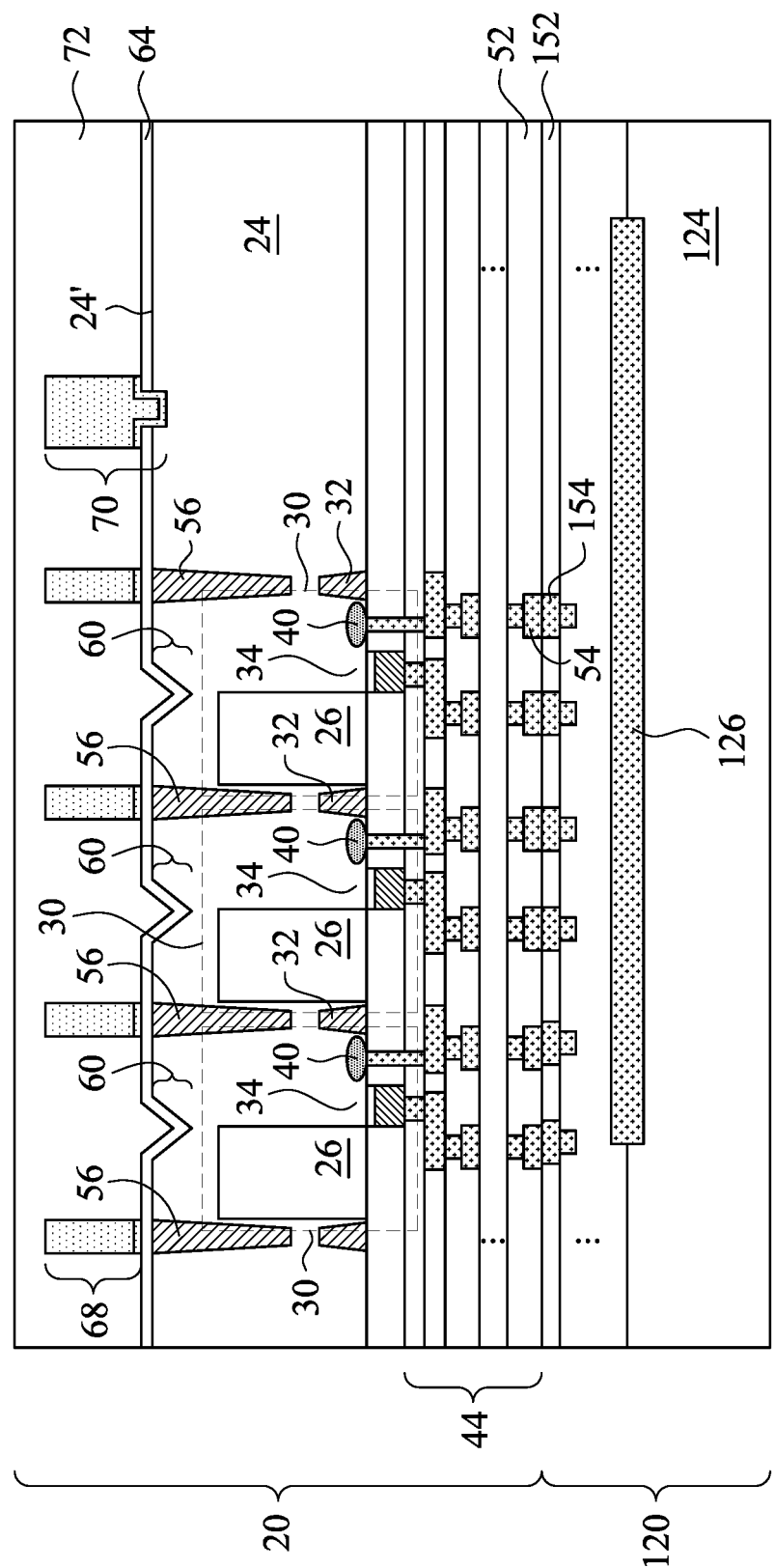

Referring to FIG. 7, after the formation of grid structure 68 and grounding structure 70, dielectric layer 72 is deposited. The respective process is illustrated as process 214 in the process flow shown in FIG. 18. In accordance with some embodiments of the present disclosure, dielectric layer 72 is formed of silicon oxide, or the like. The thickness of dielectric layer 72 may be in the range between about 4,000 Å and about 6,000 Å. Dielectric layer 72 may be planarized in a CMP process or a mechanical polish process, so that its top surface is planar. Dielectric layer 72 may or may not include a portion higher than the top surfaces of grid structure 68 and grounding structure 70. The portions of dielectric layers 64 and 72 filling BSHA openings 58 (FIG. 4) are referred to as BSHA regions 60 hereinafter.

In accordance with some embodiments, as shown in FIGS. 4 through 7, BSHA regions 60 are formed as a result of the formation of dielectric layers 64 and 72. In accordance with alternative embodiments, BSHA openings 58 are filled to form BSHA regions 60 at a time before the formation of dielectric layers 64 and 72. In the respective formation process, after BSHA openings 58 are formed, a transparent material or a plurality of transparent layers, which may include silicon oxide or a high-k dielectric material such as hafnium Oxide, aluminum Oxide, or the like may be deposited to fill into BSHA openings 58. A planarization process such as a CMP process or a mechanical polishing process is then performed, resulting in BSHA regions 60. The resulting BSHA regions 60 will have their top surfaces coplanar with the back surface 24B' of semiconductor substrate 24. In accordance with these embodiments, BSHA regions 60 may be formed before or after the formation of DTI grid structure 56.

Figure 8:
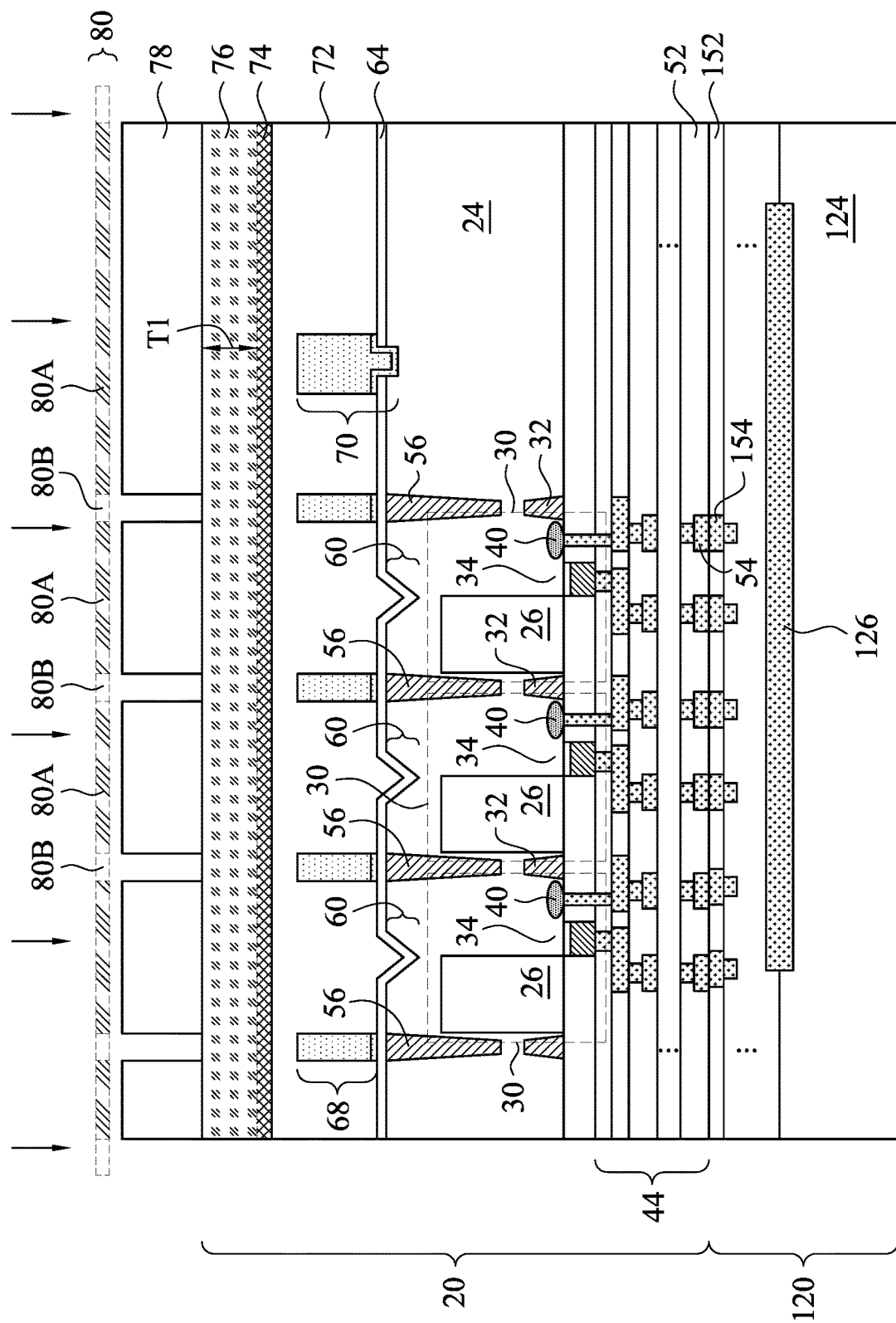

Next, as shown in FIG. 8, dielectric layer 74 is formed. Dielectric layer 74 may be used for the isolation of metal bond pads (not shown), which are used for the wire bonds that are connected to the circuits in the BSI chip. In accordance with alternative embodiments, dielectric layer 74 is either not formed, or formed and patterned, so that the portion of dielectric 74 are removed from the regions directly over pixels 30. As a result, the subsequent formed polymer grid structure 76' and/or color filters 82 (FIG. 13) may alternatively be in physical contact with dielectric layer 72. In accordance with some embodiments of the present disclosure, dielectric layer 74 is formed of silicon oxide, which may be formed through PECVD or other applicable methods. The thickness of dielectric layer 74 may be in the range between about 1,500 Å and about 2,500 Å. Dielectric layer 74 is sometimes referred to as a passivation layer.

Figure 13:
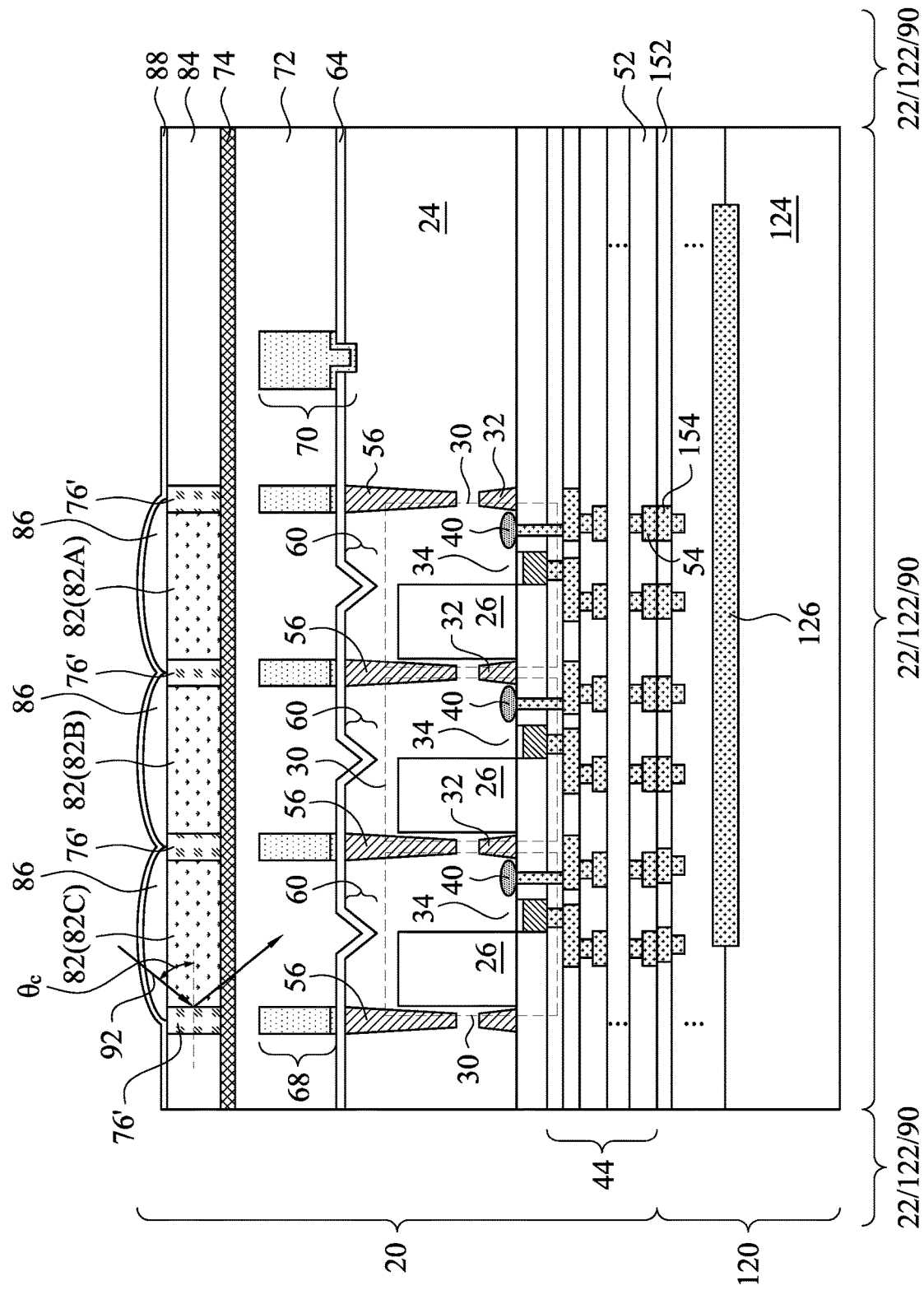

Referring to FIG. 8, low-refractivity layer 76 is formed, which may be formed as a blanket layer. The respective process is illustrated as process 216 in the process flow shown in FIG. 18. Low-refractivity layer 76 may be clear without any color, or may be white. The thickness Ti of low-refractivity layer 76 may be in the range between about 2,000 Å and about 5 nm. Low-refractivity layer 76 has a relatively low refractivity value, which is lower than the refractivity value of the subsequently formed color filters 82 (FIG. 13). In accordance with some embodiments, the refractivity of low-refractivity layer 76 is lower than about 2.0, and may be in the range between about 1.3 and about 2.0. The available material of low-refractivity layer 76 includes, and is not limited to, polymers, which may be resins, organic compounds, or the like. For example, applicable polymers for forming low-refractivity layer 76 may include, and is limited to, Polymethyl methacrylate (PMMA), epoxy acrylates, aliphatic urethane acrylates, aromatic urethane acrylates, polyester acrylates, acrylic acrylates, and the like, or combinations thereof.

Figure 9:
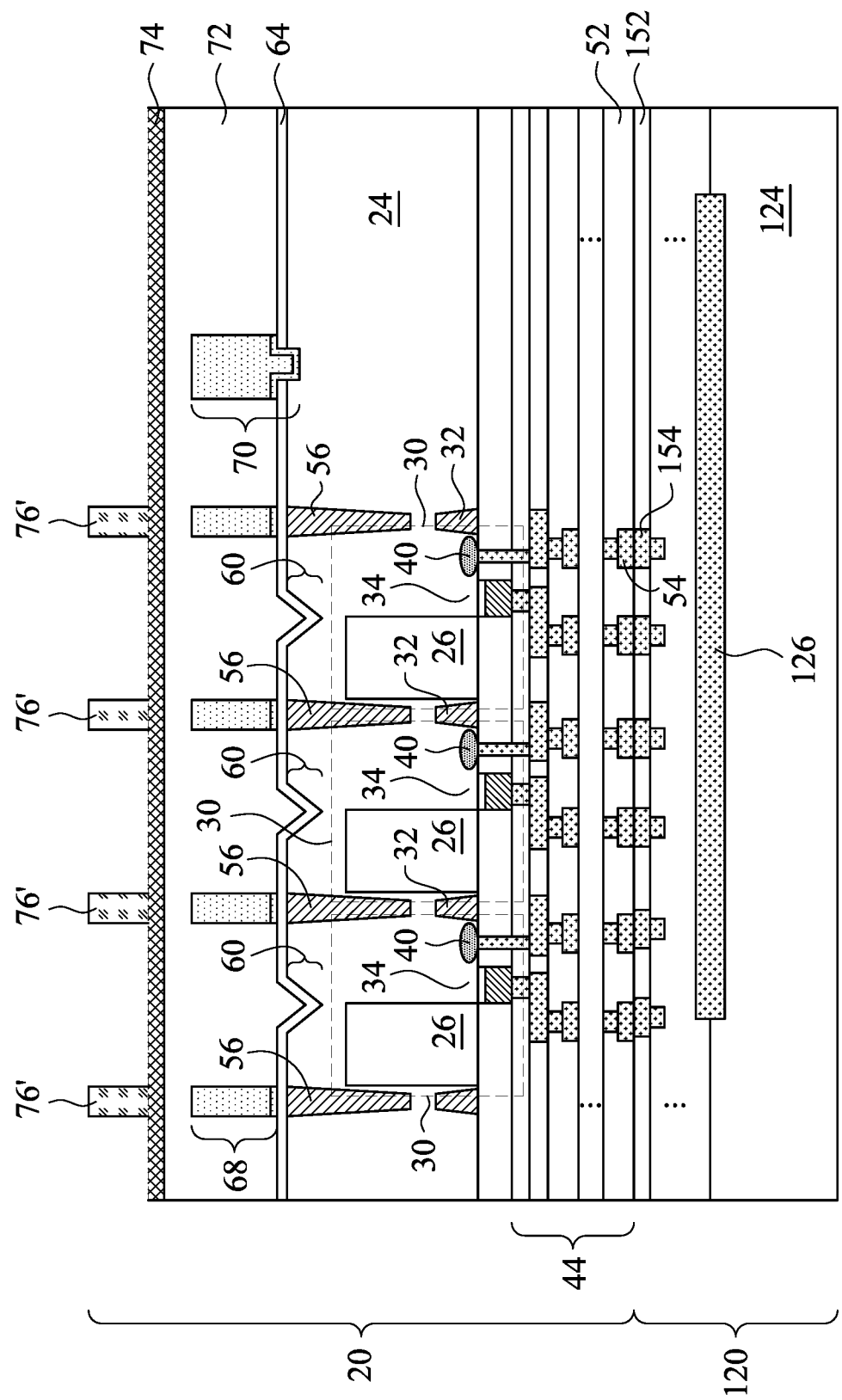

Low-refractivity layer 76 is then patterned to form grid structure 76', as shown in FIG. 9. The respective process is illustrated as process 218 in the process flow shown in FIG. 18. In accordance with some embodiments, a patterning mask 78, such as a photo resist, is formed over low-refractivity layer 76 and is then patterned. The patterning of the photo resist 78 may be performed by using lithography mask 80, which includes opaque patterns 80A and transparent patterns 80B, to light-expose photo resist 78, followed by a development process to remove some portions of the photo resist 78. The patterned photo resist 78 is then used to etch the underlying low-refractivity layer 76, and to form grid structure 76'. In accordance with alternative embodiments, low-refractivity layer 76 and the resulting grid structure 76' are formed of a photo-sensitive material, which may be resin or another organic compound, or the like. Accordingly, in the patterning of low-refractivity layer 76, etching mask 78 is not formed. Rather, the patterning of low-refractivity layer 76 is achieved by using lithography mask 80 to light-expose the photo-sensitive low-refractivity layer 76 directly, followed by a development process to remove some portions of low-refractivity layer 76. After the formation of grid structure 76', grid structure 76' is baked, so that it will not be patterned again by the subsequent patterning processes for forming color filters. A plane view of the grid structure 76' is illustrated in FIG. 16. The grid structure 76' again includes a first plurality of strips (grid lines) extending in the X-direction, and a second plurality of grid lines extending in the Y-direction and joined with the first plurality of grid lines.

In accordance with some embodiments, the widths of the strips in grid structure 76' have the same widths as that of the strips of the underlying grid structure 68, DTI grid structure 56, and STI grid structure 32. With this configuration, the underlying ones of grid structure 68, DTI grid structure 56, and STI grid structure 32 do not extend laterally beyond the overlying ones of grid structure 76', grid structure 68, and DTI grid structure 56, and do not have any top surface not covered by the corresponding overlying grid structures. Since top surfaces may reflect light back upward, with the grid structures being vertically aligned, light will not be undesirably reflected back by the top surfaces.

In accordance with alternative embodiments, grid structure 76' may be formed using other methods, for example, a sacrificial layer may be deposited (or applied) as a blanket layer, followed by a lithography process. The resulting patterned sacrificial layer may have a grid pattern similar to that of the illustrated photo resist 78 in FIG. 8. Grid structure 76' is then filled into the trenches in the sacrificial layer, followed by the removal of the sacrificial layer, leaving polymer grid structure 76'.

Figure 10:
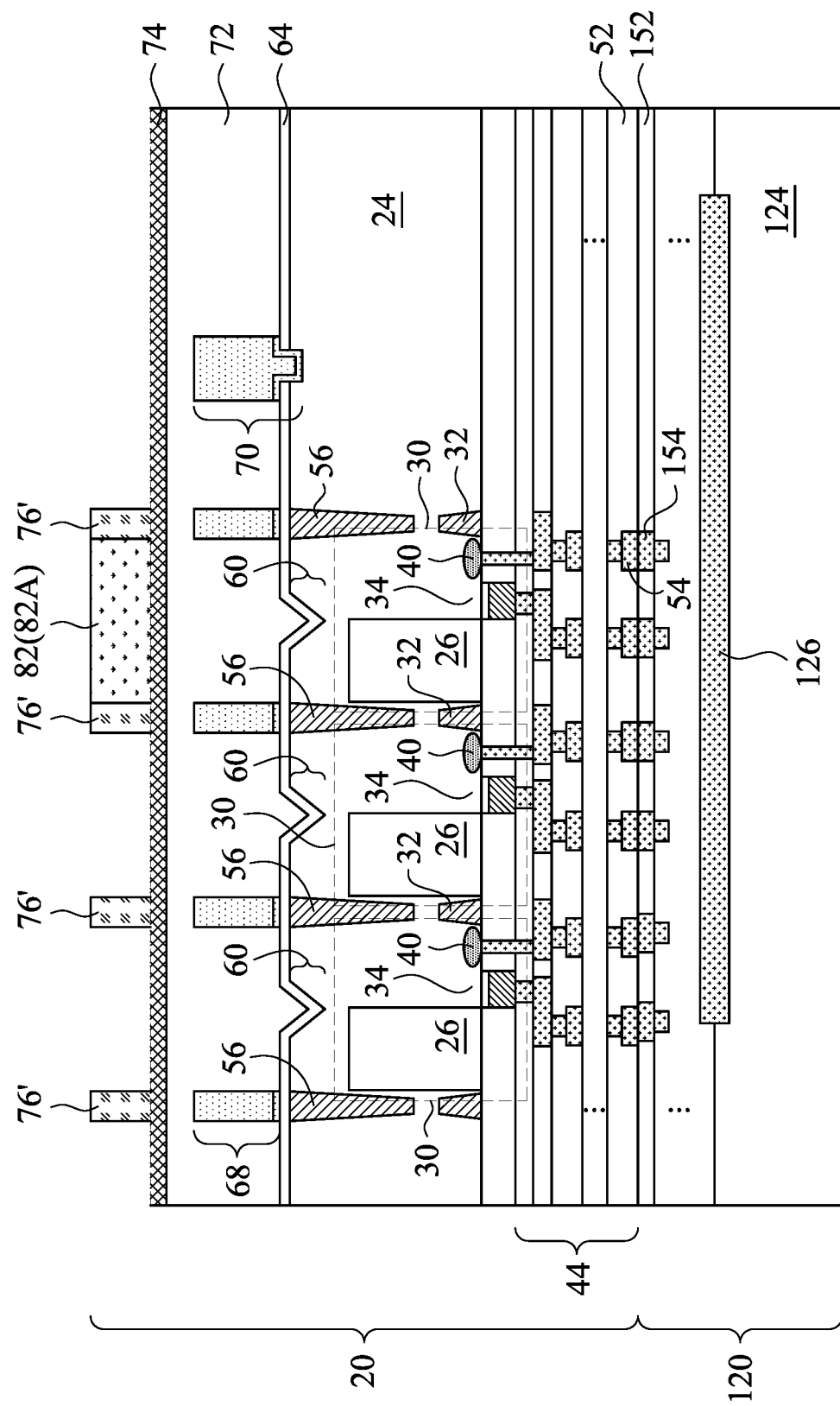
Figure 11:
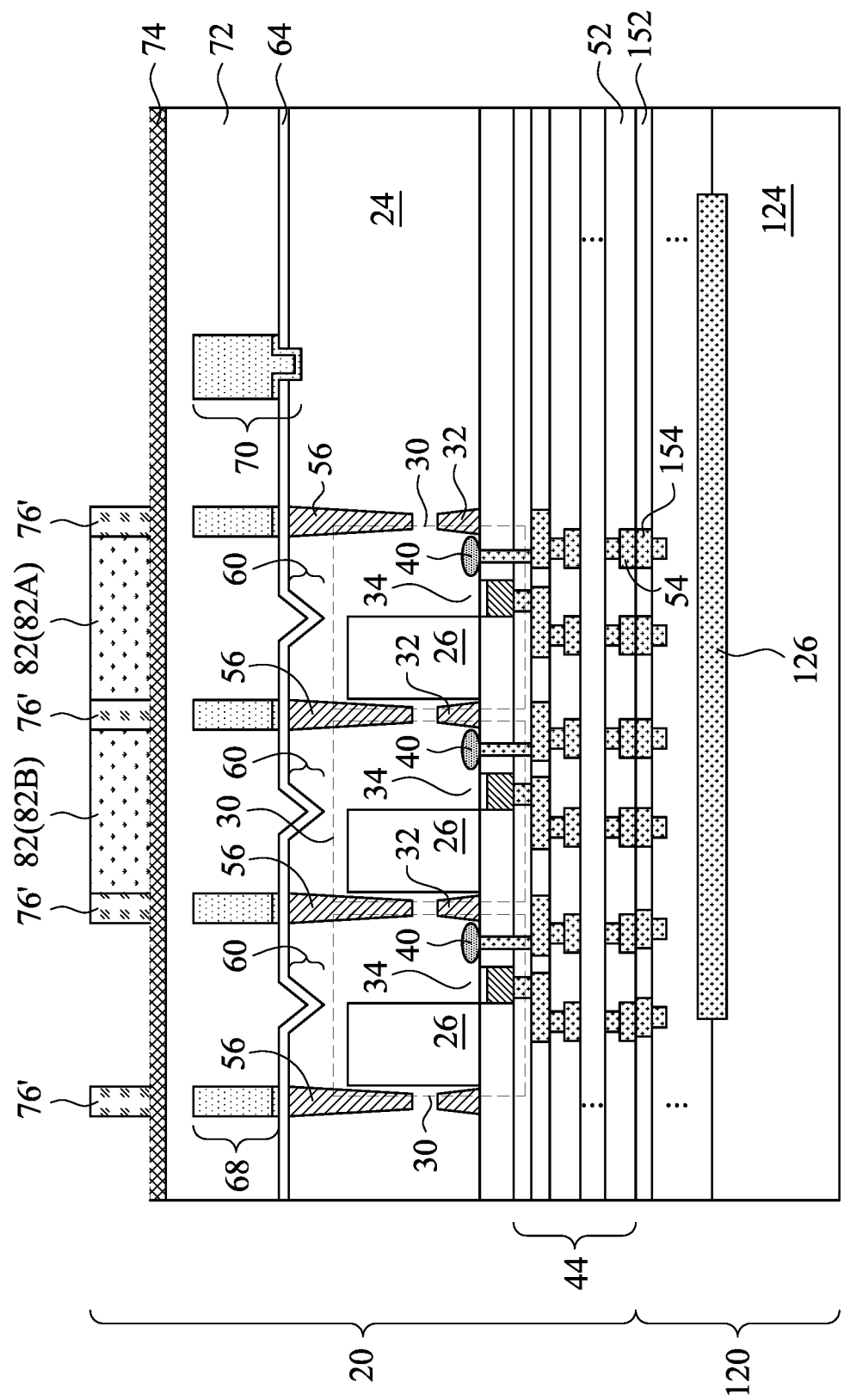
Figure 12:
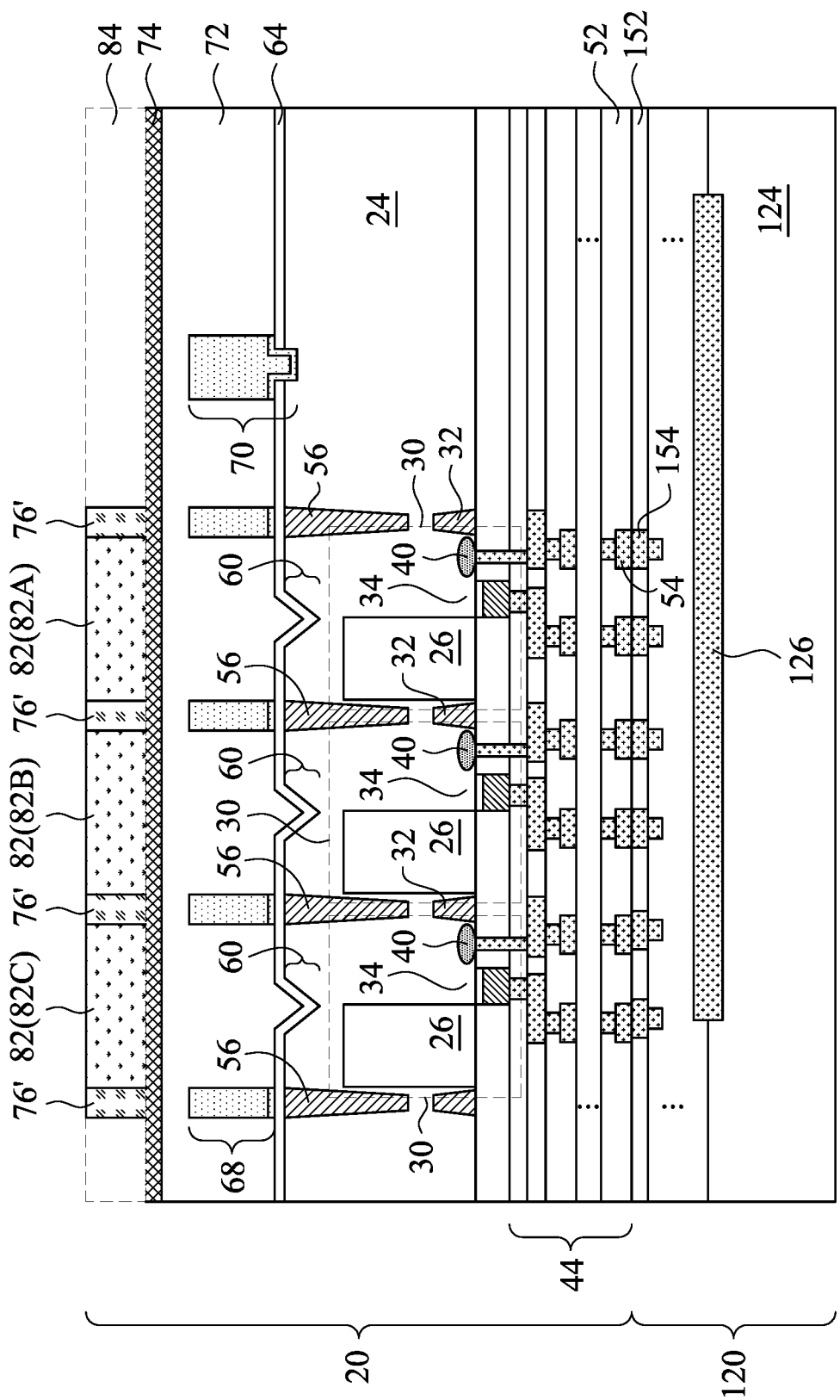

FIGS. 10 through 12 illustrate some example processes for forming color filters 82 (which include color filters 82A, 82B, and 82C) in the grid openings of grid structure 76'. The respective process is illustrated as process 220 in the process flow shown in FIG. 18. Referring to FIG. 10, first color filters 82A, which are of a first color (such as red), are filled into some of the grid openings in the grid structure 76'. In accordance with some embodiments, the filling process includes dispensing the respective color filter materials, and removing the respective color filter materials having the first color through a photo lithography process. The respective color filters are denoted as 82A. Color filters 82A are baked so that they will not be removed by the subsequent lithography processes as shown in FIGS. 11 and 12.

Referring to FIG. 11, second color filters 82B, which are of a second color (such as green), are filled into some of the grid openings in the grid structure 76'. The filling process may include a dispensing process and a photo-lithography process. The respective color filters are denoted as 82B. Color filters 82B are also baked so that they will not be removed by the subsequent lithography processes as shown in FIG. 12.

FIG. 12 illustrates the formation of third color filters 82C, which are of a third color (such as blue), filling into the rest of the grid openings in the grid structure 76'. The filling process may include a dispensing process and a lithography process. The respective color filters are denoted as 82C.

In accordance with some embodiments, color filters 82A, 82B, and 82C are also formed of polymers, which may be resins, organic compounds, or the like, and which are dyed to have different colors. The materials of color filters 82A, 82B, and 82C have a relatively higher refractivity value compared to the refractivity value of low-refractivity layer 76 and the respective grid structure 76'. In accordance with some embodiments, the refractivity value of color filters 82A, 82B, and 82C are higher than about 2.0, and may be in the range between about 2.0 and about 4.0. Furthermore, when the refractivity values of color filters 82A, 82B, and 82C are expressed as N82, and the refractivity value of grid structure 76' is expressed as N76, the difference (N82−N76) is high (by selecting appropriate materials), so that incident light with smaller incident angles may also have total reflection along with the incident light having large incident angles. In accordance with some embodiments, the difference (N82−N76) is greater than about 0.3, greater than about 0.5, and may be in the range between about 0.3 and about 1. The high refractivity value difference (N82−N76) is beneficial for the total reflection of light, as will be discussed referring to FIG. 13.

In accordance with some embodiments, after the formation of color filters 82A, 82B, and 82C, a planarization process may be performed to further planarize the top surfaces of grid structure 76' and color filters 82A, 82B, and 82C. Accordingly, the top surfaces of grid structure 76' and color filters 82A, 82B, and 82C are coplanar. In accordance with some embodiments, a dielectric layer 84, which may be formed of silicon oxide or like materials, is deposited, and is planarized along with grid structure 76' and color filters 82A, 82B, and 82C. Dielectric layer 84 may be removed after the planarization, or may be left in the final image sensor chip. In accordance with alternative embodiments, the planarization is performed without forming dielectric layer 84. Accordingly, dielectric layer 84 is shown as dashed to indicate that it may or may not be formed.

In subsequent processes, as shown in FIG. 13, additional components such as micro-lenses 86 are then formed. The respective process is illustrated as process 222 in the process flow shown in FIG. 18. Each of image sensors 26 is aligned to one of micro-lenses 86. Image sensor chip 22 (and corresponding wafer 20) is thus formed. There may be a protection layer 88 formed on the micro-lenses 86, for example, by depositing a conformal silicon oxide layer. The respective process is illustrated as process 224 in the process flow shown in FIG. 18. In subsequent processes, image sensor wafer 20 and wafer 120 are sawed into packages 90, each including one of image sensor chips 22 and one of device chips 122.

Forming grid structure 76' has the advantage of reducing delamination. If grid structure 76' is formed of metals or other dielectric materials that have properties (such as Coefficient of Thermal Expansion (CTE)) significantly different from that of color filters, delamination may be generated between the color filters 82 and the grid structure 76'. Since the grid structure 76' in accordance with the embodiments of the present disclosure and color filters are formed of similar materials having similar properties, the delamination is reduced. Furthermore, grid structure 76' may act as an effective grid for reducing and preventing the cross-talk of the light signals intended for different pixels. For example, according to Snell's law, the equation (Sin θc= (N76/(N82)*Sin 90) determines the minimum incident angle θc, at which the total reflection of light 92 may still occur. By making the refractivity value N82 of color filters 82 to be higher than the refractivity value N76 of grid structure 76, all light 92 with incident angle equal to or greater than the incident angle θc will have the total reflection, and hence grid structure 76' may reduce crosstalk. In accordance with some embodiments, grid structure 76' and the underlying grid structure 68, DTI grid structure 56, and STI grid structure 32 collectively form the crosstalk prevention structure.

Figure 14:
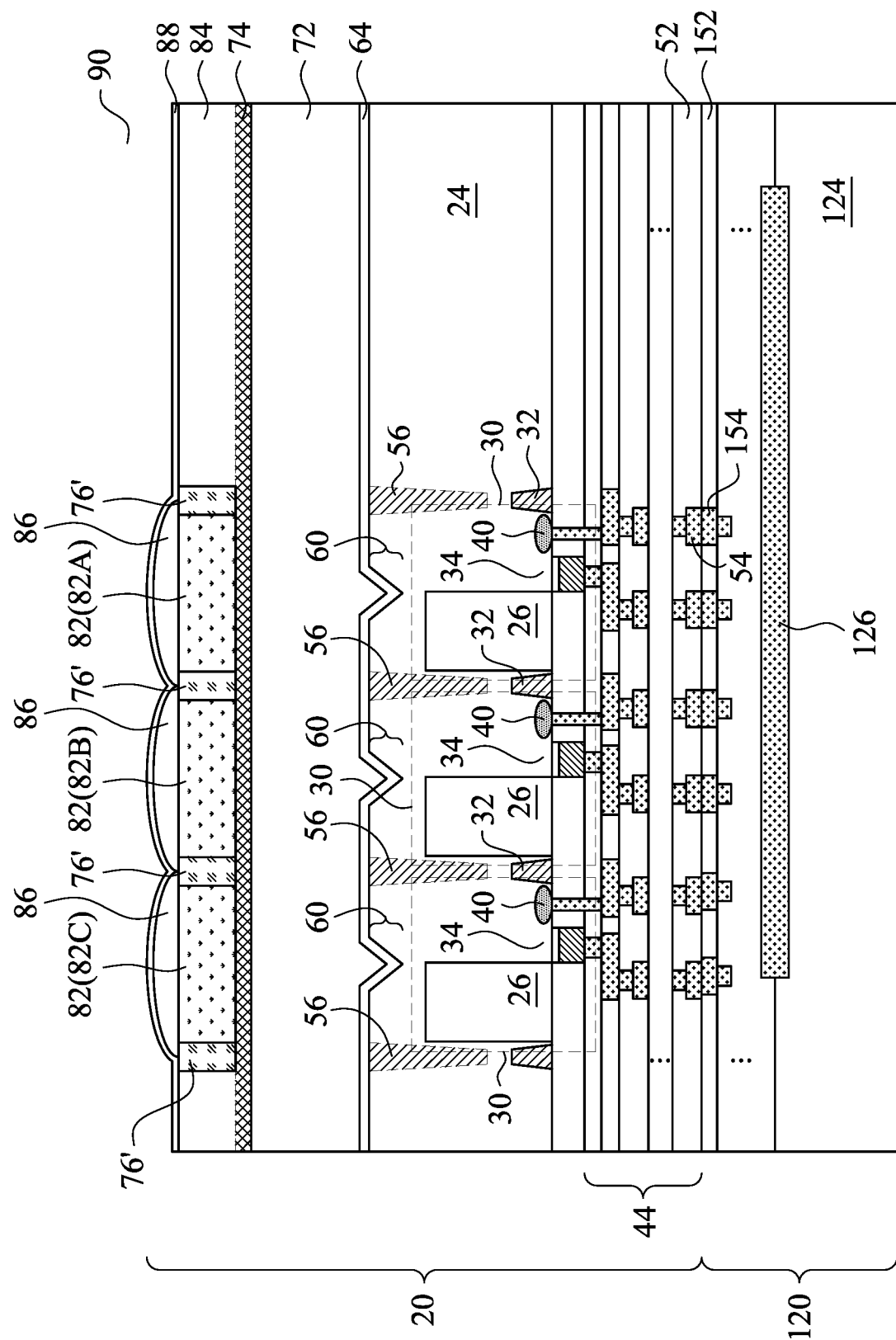
FIG. 14 illustrates an image sensor chip having a low-refractivity grid structure in accordance with some embodiments.

FIG. 14 illustrates package 90 in accordance with alternative embodiments. Due to the formation of grid structure 76', some of the underlying grid structures may be omitted. For example, FIG. 14 illustrates package 90 in accordance with some embodiments, wherein the grid structure 68 as shown in FIG. 13 is not formed. Furthermore, DTI grid structure 56 is illustrated as dashed to indicate it may or may not be formed in accordance with different embodiments of the present disclosure.

Figure 15:
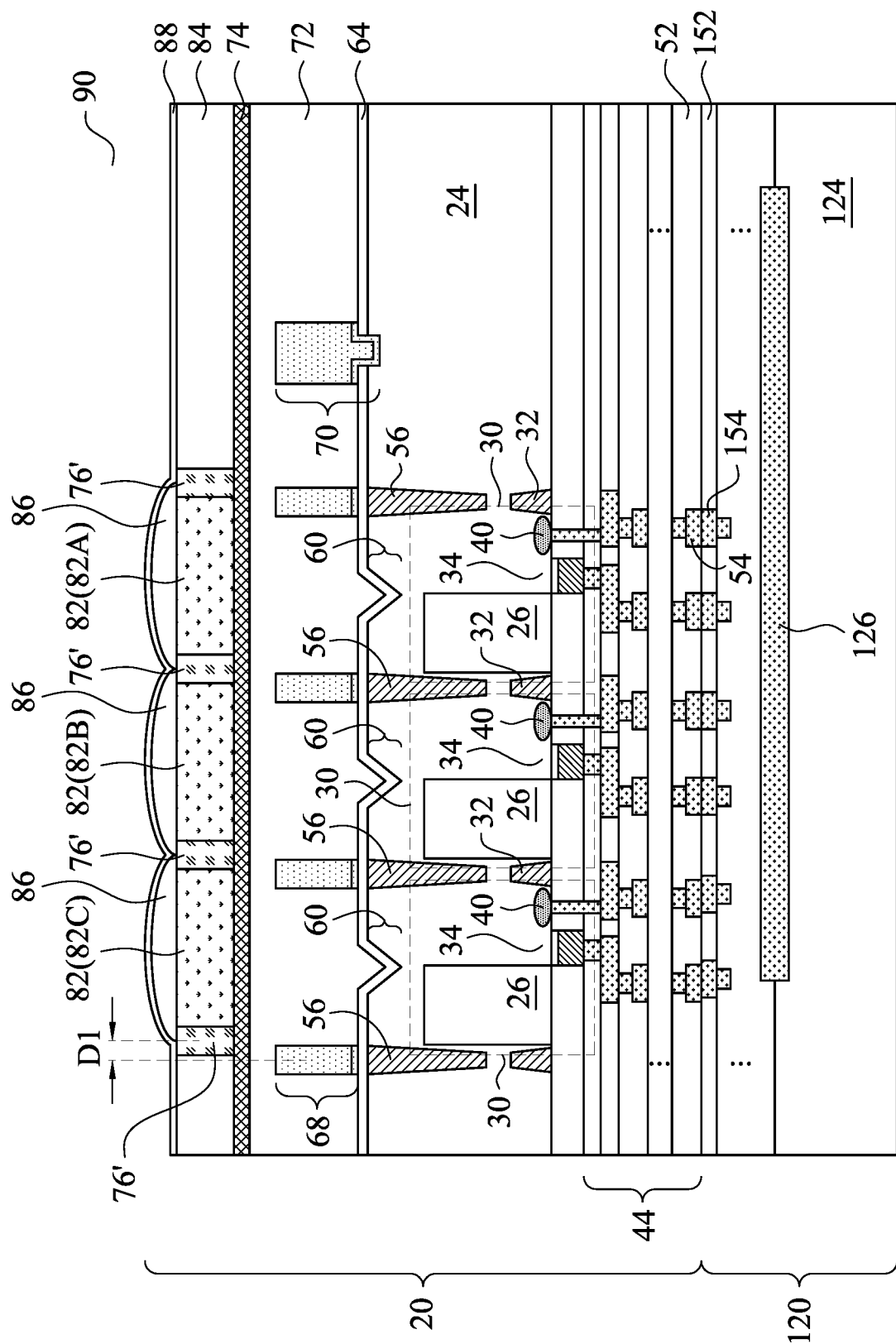
FIG. 15 illustrates an image sensor chip having a low-refractivity grid structure that is offset from underlying grid structures in accordance with some embodiments.

In accordance with some embodiments, as shown in FIGS. 13 and 14, grid structure 76' is vertically aligned to grid structure 68, DTI grid structure 56 and STI grid structure 32. In accordance with other embodiments, grid structure 76' is vertically offset from grid structure 68, DTI grid structure 56 and STI grid structure 32, as shown in FIG. 15. Although not illustrated in FIG. 15, DTI grid structure 56 may offset slightly to the left from the overlying grid structure 68, and/or STI grid structure 32 may offset slightly to the left from the overlying DTI grid structure 56. These embodiments may be used for sensing the light that is more likely to be projected on BSI chip 22 from one direction rather than all directions. For example, light may be projected from top right direction toward the bottom left direction. In accordance with some embodiments, the center of a grid line of grid structure 76' is offset from the center of the corresponding grid line of the underlying grid structure 68 and/or DTI grid structure 56 and STI grid structure 32 by offset distance D1, which may be greater than about 100 Å, and may be in the range between about 500 Å and about 5,000 Å.

FIG. 16 illustrates a plane view of color filters 82, grid structure 76', metal grid structure 68, DTI grid structure 56, and STI grid structure 32 in accordance with some embodiments. Each of the grid structures 76', 56, and 32 may include a first plurality of strips extending in the X-direction, and a second plurality of strips extending in the Y-direction and joining the first plurality of strips. Color filters 82 are formed in the grid openings of, and hence are encircled by, grid structure 76'. Grid structures 68, 56 and 32 may be formed underlying, and overlapped by, grid structure 76'.

The embodiments of the present disclosure have some advantageous features. Since the polymer grid structure has properties similar to that of color filters, the delamination between the polymer grid structure and the color filters is reduced or eliminated. Also, the polymer grid structure has a lower refractivity value than the color filters. Accordingly, total reflection may occur, making the polymer grid structure an effective light-reflecting grid.

In accordance with some embodiments of the present disclosure, a method includes forming image sensors in a semiconductor substrate; thinning the semiconductor substrate from a backside of the semiconductor substrate; forming a dielectric layer on the backside of the semiconductor substrate; forming a polymer grid on the backside of the semiconductor substrate, wherein the polymer grid has a first refractivity value; forming color filters in the polymer grid, wherein the color filters has a second refractivity value higher than the first refractivity value; and forming micro-lenses on the color filters. In an embodiment, the forming the polymer grid comprises dispensing a polymer layer; and patterning the polymer layer to form the polymer grid. In an embodiment, the method further comprises, before the polymer grid is formed, forming a metal grid on the backside of the semiconductor substrate, wherein the polymer grid is vertically aligned to the metal grid. In an embodiment, the method further comprises forming backside high-absorption regions extending into the semiconductor substrate from a back surface of the semiconductor substrate, wherein grid openings of the polymer grid are aligned to the backside high-absorption regions. In an embodiment, the method further comprises forming a deep-trench isolation grid extending into the semiconductor substrate from the backside of the semiconductor substrate, wherein the deep-trench isolation grid is aligned to the polymer grid. In an embodiment, the second refractivity value is greater than the first refractivity value by a difference greater than about 0.5. In an embodiment, the polymer grid is formed before the color filters are formed, and the color filters are filled into grid openings of the polymer grid.

In accordance with some embodiments of the present disclosure, a device includes a BSI image sensor chip that includes a semiconductor substrate; image sensors in the semiconductor substrate; a polymer grid over the semiconductor substrate, wherein the polymer grid is on a backside of the semiconductor substrate; and color filters filling grid openings of the polymer grid. In an embodiment, the polymer grid has a first refractivity value, and the color filters have a second refractivity value higher than the first refractivity value. In an embodiment, a difference between the second refractivity value and the first refractivity value is greater than about 0.5. In an embodiment, first sidewalls of the color filters contact second sidewalls of the polymer grid to form vertical interfaces. In an embodiment, a top surface of the polymer grid is coplanar with top surfaces of the color filters. In an embodiment, the device further comprises a metal grid over the semiconductor substrate and underlying the polymer grid, wherein the metal grid is vertically aligned to the polymer grid. In an embodiment, the device further comprises a metal grid over the semiconductor substrate and underlying the polymer grid, wherein the polymer grid is horizontally offset from the metal grid. In an embodiment, the device further comprises a deep-trench isolation grid in the semiconductor substrate, wherein the deep-trench isolation grid is vertically aligned to the polymer grid.

In accordance with some embodiments of the present disclosure, device includes a semiconductor substrate; image sensors in the semiconductor substrate; a deep-trench isolation grid in the semiconductor substrate; a metal grid over the semiconductor substrate; a polymer grid over the metal grid, wherein first grid lines of the polymer grid, second grid lines of the metal grid, and third grid lines of the deep-trench isolation grid are vertically aligned, and wherein the image sensors are vertically aligned to grid openings of the polymer grid, the metal grid, and the deep-trench isolation grid; color filters in the grid openings of the polymer grid, wherein a first refractivity value of the polymer grid is smaller than a second refractivity value of the color filters; and micro-lenses over the color-filters. In an embodiment, a difference between the second refractivity value and the first refractivity value is greater than about 0.5. In an embodiment, the device further comprises a dielectric layer filling the metal grid, wherein a portion of the dielectric layer extends higher than the metal grid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a Backside Illumination (BSI) image sensor chip comprising:
      a semiconductor substrate;
      image sensors in the semiconductor substrate;
      a metal grid over the image sensor;
      a polymer grid over the metal grid, wherein the metal grid and the polymer grid are on a backside of the semiconductor substrate, and wherein the metal grid comprises a first grid line, the polymer grid comprises a second grid line overlapping the first grid line, and wherein an entirety of the second grid line is vertically misaligned from a center line of the first grid line;
      color filters filling grid openings of the polymer grid; and
      a deep-trench isolation grid in the semiconductor substrate, wherein the deep-trench isolation grid is vertically aligned to the metal grid, and is vertically misaligned from the polymer grid; and
   a dielectric layer, wherein the dielectric layer and one of the color filters contact opposing sidewalls of a strip of the polymer grid, and wherein the color filters comprise first top surfaces, and the dielectric layer comprises a second top surface coplanar with the first top surfaces.

2. The device of claim 1, wherein the polymer grid has a first refractivity value, and the color filters have a second refractivity value higher than the first refractivity value.

3. The device of claim 2, wherein a difference between the second refractivity value and the first refractivity value is greater than about 0.5.

4. The device of claim 1, wherein first sidewalls of the color filters contact second sidewalls of the polymer grid to form vertical interfaces.

5. The device of claim 1, wherein a top surface of the polymer grid is coplanar with top surfaces of the color filters.

6. The device of claim 1, wherein the polymer grid comprises a resin.

7. The device of claim 1, wherein an entirety of an edge of the second grid line is directly over the first grid line.

8. A device comprising:
a semiconductor substrate;
image sensors in the semiconductor substrate;
a deep-trench isolation grid in the semiconductor substrate;
a metal grid over the semiconductor substrate;
a polymer grid over the metal grid, wherein the image sensors are vertically aligned to grid openings of the metal grid, and wherein a first grid line of the polymer grid comprises:
a first sidewall overlapping a second grid line of the metal grid; and
a second sidewall vertically misaligned from the second grid line of the metal grid, wherein the first sidewall and the second sidewall are opposite sidewalls of the first grid line;
color filters in grid openings of the polymer grid, wherein a first refractivity value of the polymer grid is smaller than a second refractivity value of the color filters;
micro-lenses over the color filters;
a dielectric layer on opposite sides of a combined region comprising the polymer grid and the color filters; and
a protection layer over and contacting the micro-lenses, wherein the protection layer contacts a top surface of the dielectric layer to form a first horizontal interface.

9. The device of claim 8, wherein a difference between the second refractivity value and the first refractivity value is greater than about 0.5.

10. The device of claim 8 further comprising an additional dielectric layer filling the metal grid, wherein a portion of the dielectric layer extends higher than the metal grid.

11. The device of claim 8, wherein the deep-trench isolation grid is vertically aligned to the metal grid, and is vertically misaligned from the polymer grid.

12. The device of claim 8, wherein grid lines of the polymer grid have same widths as grid lines of the metal grid.

13. The device of claim 8, wherein first top surfaces of the polymer grid are coplanar with second top surfaces of the color filters.

14. A device comprising:
an image sensor chip comprising:
a semiconductor substrate;
a shallow trench isolation grid extending from a front surface of the semiconductor substrate into the semiconductor substrate;
a deep-trench isolation grid extending from a back surface of the semiconductor substrate to an intermediate level of the semiconductor substrate, wherein the deep-trench isolation grid is vertically aligned to, and is spaced apart from, the shallow trench isolation grid;
a plurality of image sensors extending into the semiconductor substrate;
a plurality of transistors comprising portions on a front side of the semiconductor substrate;
a metal grid on a backside of the semiconductor substrate, wherein the metal grid comprises first grid lines;
a light-reflecting grid on the backside of the semiconductor substrate, wherein the light-reflecting grid comprises a polymer; and
color filters in the light-reflecting grid, wherein the color filters and the light-reflecting grid are configured so that a light beam in one of the color filters is reflected from the light-reflecting grid through a total reflection;
micro-lenses over the color filters; and
a protection layer over and contacting the micro-lenses, wherein a portion of the protection layer is between two of the micro-lenses, and the portion of the protection layer is in contact with an underlying portion of the light-reflecting grid.

15. The device of claim 14, wherein the light-reflecting grid has a first refractivity value, and the color filters have a second refractivity value higher than the first refractivity value.

16. The device of claim 14 further comprising an oxide layer, wherein both of the color filters and the light-reflecting grid are in contact with, and form interfaces with, a top surface of the oxide layer.

17. The device of claim 8, wherein the top surface of the dielectric layer is coplanar with top surfaces of the polymer grid.

18. The device of claim 1, wherein the second grid line of the polymer grid comprises:
a first sidewall overlapping the first grid line of the metal grid; and
a second sidewall vertically misaligned from the first grid line of the metal grid, wherein the first sidewall and the second sidewall are opposite sidewalls of the second grid line.

19. The device of claim 14, wherein the polymer is selected from the group consisting of Polymethyl methacrylate (PMMA), epoxy acrylates, aliphatic urethane acrylates, aromatic urethane acrylates, polyester acrylates, acrylic acrylates, and combinations thereof.

20. The device of claim 19, wherein the polymer comprises the PMMA.

* * * * *